(12) United States Patent
Shimodaira

(10) Patent No.: US 10,279,473 B2
(45) Date of Patent: May 7, 2019

(54) IMAGE PROCESSING DEVICE, IMAGE PROCESSING METHOD, AND COMPUTER PROGRAM

(71) Applicant: Keyence Corporation, Osaka (JP)

(72) Inventor: Masato Shimodaira, Osaka (JP)

(73) Assignee: Keyence Corporation, Osaka (JP)

( * ) Notice: Subject to any disclaimer, the term of this patent is extended or adjusted under 35 U.S.C. 154(b) by 0 days.

(21) Appl. No.: 15/895,263

(22) Filed: Feb. 13, 2018

(65) Prior Publication Data

US 2018/0250813 A1    Sep. 6, 2018

(30) Foreign Application Priority Data

Mar. 3, 2017    (JP) .................. 2017-040637

(51) Int. Cl.
*G06F 7/00*        (2006.01)
*B25J 9/16*        (2006.01)
*G06T 7/00*        (2017.01)
*G06T 17/10*       (2006.01)
*G06F 17/50*       (2006.01)

(52) U.S. Cl.
CPC .......... *B25J 9/1605* (2013.01); *B25J 9/1697* (2013.01); *G06T 7/0006* (2013.01); *G06T 17/10* (2013.01); *G06F 17/50* (2013.01); *G06T 2200/04* (2013.01); *G06T 2207/30164* (2013.01); *Y10S 901/02* (2013.01); *Y10S 901/47* (2013.01)

(58) Field of Classification Search
None
See application file for complete search history.

(56) References Cited

U.S. PATENT DOCUMENTS

2013/0301909 A1* 11/2013 Sato .................. G01B 11/25
                                              382/154
2015/0290795 A1* 10/2015 Oleynik ............. G05B 19/42
                                              700/257
2017/0348854 A1* 12/2017 Oleynik ............. B25J 9/1605

FOREIGN PATENT DOCUMENTS

JP    2011112400    6/2011
JP    2016120567    7/2016

OTHER PUBLICATIONS

U.S. Appl. No. 15/893,736, filed Feb. 12, 2018 (254 pages).
(Continued)

*Primary Examiner* — Yolanda R Cumbess
(74) *Attorney, Agent, or Firm* — Kilyk & Bowersox, P.L.L.C.

(57) ABSTRACT

A workpiece model is created based on three-dimensionally measured data obtained by performing a three-dimensional measurement on a working space in which the workpieces are loaded in bulk. Holding data including a holding position of the workpiece model and a posture of a holding unit of a robot are set by setting a model coordinate system. The setting of the model coordinate system and the setting of the holding data are repeated while sequentially changing the posture of the workpiece, and multiple pieces of holding data are stored such that the multiple pieces of holding data correspond to the workpiece models. A three-dimensional search process is performed on the obtained three-dimensionally measured data, and an operation of the holding unit of the robot is controlled based on the holding data set to the workpiece model.

9 Claims, 17 Drawing Sheets

(56) References Cited

OTHER PUBLICATIONS

U.S. Appl. No. 15/893,741, filed Feb. 12, 2018 (257 pages).
U.S. Appl. No. 15/893,852, filed Feb. 12, 2018 (255 pages).
U.S. Appl. No. 15/894,183, filed Feb. 12, 2018 (444 pages).
U.S. Appl. No. 15/894,962, filed Feb. 13, 2018 (434 pages).
U.S. Appl. No. 15/895,467, filed Feb. 13, 2018 (171 pages).

* cited by examiner

FIG. 13A
FIG. 13B
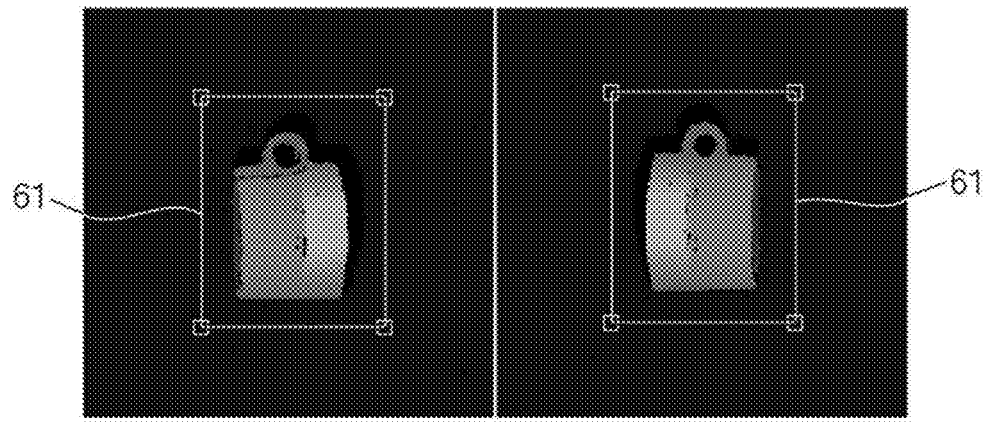
FIG. 13C
FIG. 13D
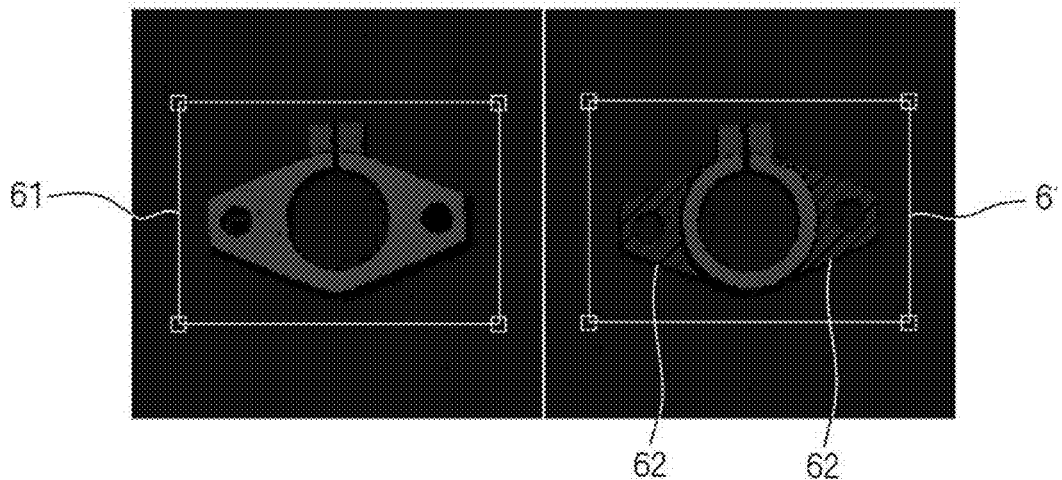
FIG. 13E
FIG. 13F
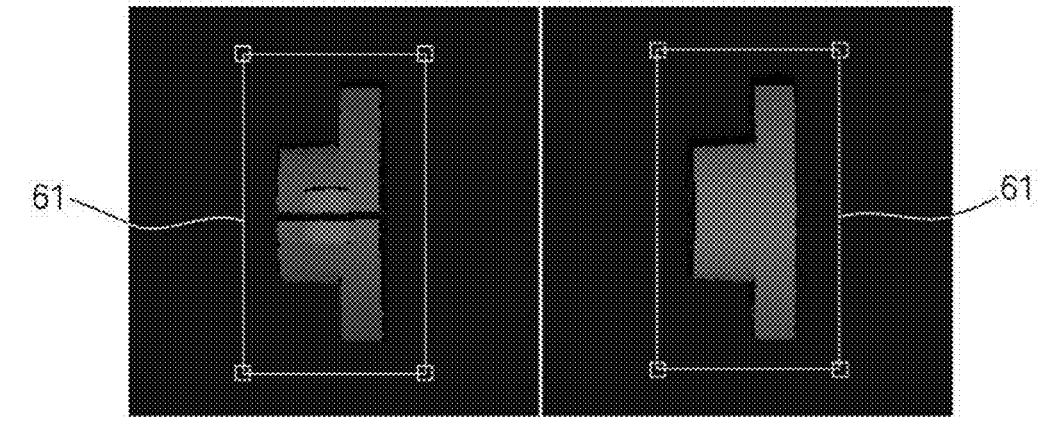

IMAGE PROCESSING DEVICE, IMAGE PROCESSING METHOD, AND COMPUTER PROGRAM

CROSS-REFERENCE TO RELATED APPLICATIONS

The present application claims foreign priority based on Japanese Patent Application No. 2017-040637, filed Mar. 3, 2017, the contents of which is incorporated herein by reference.

BACKGROUND OF THE INVENTION

1. Field of the Invention

The present invention relates to an image processing device, an image processing method, and a computer program, which are capable of registering a workpiece model as a target for a three-dimensional search based on three-dimensional data obtained by performing a three-dimensional measurement on workpieces loaded in bulk, and capable of setting a coordinate system based on the shape of the workpiece model.

2. Description of Related Art

A 3D picking technology has been developed to be able to automatically perform a picking operation by a robot in a factory. For example, by moving a holding unit of the robot on a 3D-CAD, the holding unit of the robot is guided to a position where the holding unit is capable of holding a workpiece, and a positional relationship between the workpiece and the holding unit of the robot is detected and registered. Therefore, it is possible to reliably control and move the holding unit of the robot to the position where the holding unit is capable of holding the workpiece.

For example, JP-A-2011-112400 discloses a three-dimensional visual sensor which creates a three-dimensional model using CAD data for a workpiece (a recognition target) and registers the model as a target for a three-dimensional search. In JP-A-2011-112400, an exact position and an exact posture of the workpiece may be obtained by performing conversion between a coordinate system on CAD data and a coordinate system for measurement, and specifying a rotation angle of the registered three-dimensional model.

In addition, JP-A-2016-120567 discloses a method of obtaining, without using CAD data, a position for holding a workpiece based on a relationship between a master position on an image obtained by actually capturing an image of the workpiece and a robot position coordinate when holding the workpiece at the master position, during the picking operation of the robot using a two-dimensional camera.

SUMMARY OF THE INVENTION

However, in the case of the method disclosed in JP-A-2011-112400, it is impossible to register the model from the first in the case where CAD data are not on hand. In addition, even if CAD data are prepared, a model coordinate system is set based on the CAD data. Thus, for example, even if multiple parts having partially common shapes are present in an overall shape of the workpiece, it is necessary to repeatedly register holding postures for respective parts several times. As a result, there is a problem in that an operation of setting holding data is complicated.

In the method disclosed in JP-A-2016-120567, the position for holding the workpiece is obtained based on the relationship between the master position on the image obtained by actually capturing an image of the workpiece and the robot position coordinate when holding the workpiece at the master position. As a result, there is a problem in that it is necessary to register the position of the workpiece which will be the master position and the holding position of the robot again in the case in which a relative positional relationship between an image capturing unit and the robot is changed by a factor such as a secular change, an environmental change, or impact.

The present invention has been made in consideration of the aforementioned situations, and provides an image processing device, an image processing method, and a computer program capable of registering a workpiece model, which is a target for a three-dimensional search, based on three-dimensional data obtained by three-dimensional measurement even if CAD data are not present, and capable of setting a workpiece model and a holding position with a high degree of freedom such that it is not necessary to register the holding position again even if a relative positional relationship between an image capturing unit and a robot is changed.

To achieve the object, according to a first aspect, there is provided an image processing device that controls a picking operation of a robot in which the robot holds workpieces loaded in bulk using a holding unit and moves a held workpiece to a predetermined position. The image processing device includes: a sensing unit that obtains three-dimensionally measured data by performing a three-dimensional measurement on a working space in which the workpieces are loaded in bulk; a workpiece model creating unit that creates a workpiece model indicating a shape of the workpiece, except for a background region portion of the workpiece, based on the three-dimensionally measured data obtained by the three-dimensional measurement; a coordinate system setting unit that sets a model coordinate system of the created workpiece model; a holding data setting unit that sets holding data, as relative position data in the set model coordinate system, including a holding position of the workpiece model and a posture of the holding unit of the robot when holding the holding position; a holding data storage unit that repeats setting of the model coordinate system and setting of the holding data with respect to multiple workpiece models created based on the three-dimensionally measured data obtained by the three-dimensional measurement while sequentially changing the posture of the workpiece, and stores multiple pieces of holding data such that the multiple pieces of holding data correspond to the workpiece models, respectively; a search process performing unit that performs a three-dimensional search process using the multiple created workpiece models with respect to the three-dimensionally measured data obtained by the three-dimensional measurement; and a control unit that controls an operation of the holding unit of the robot so as to hold the workpiece model succeeded in the three-dimensional search process based on the holding data corresponding to the workpiece model succeeded in the three-dimensional search process by the search process performing unit.

According to the image processing device of a second aspect of the present invention, the workpiece model creating unit in the first aspect of the present invention may include: a setting receiving unit that receives setting of a threshold value in a height direction in the set model coordinate system; and a background region adjusting unit that sets a region having information about a height equal to or lower than the threshold value in the height direction as the background region portion.

According to the image processing device of a third aspect of the present invention, the coordinate system setting unit in the first or second aspect of the present invention may set the model coordinate system of the workpiece model based on shape information indicating a shape of the created workpiece model.

To achieve the object, according to a fourth aspect of the present invention, there is provided an image processing method which is capable of being performed by an image processing device that controls a picking operation of a robot in which the robot holds workpieces loaded in bulk with a holding unit and moves a held workpiece to a predetermined position. The image processing method includes: a first process of obtaining three-dimensionally measured data by performing a three-dimensional measurement on a working space in which the workpieces are loaded in bulk; a second process of creating a workpiece model indicating a shape of the workpiece, except for a background region portion of the workpiece, based on the three-dimensionally measured data obtained by the three-dimensional measurement; a third process of setting a model coordinate system of the created workpiece model; a fourth process of setting holding data, as relative position data in the set model coordinate system, including a holding position of the workpiece model and a posture of the holding unit of the robot when holding the holding position; a fifth process of repeating the setting of the model coordinate system and the setting of the holding data with respect to multiple workpiece models created based on the three-dimensionally measured data obtained by the three-dimensional measurement while sequentially changing the posture of the workpiece, and storing multiple pieces of holding data such that the multiple pieces of holding data correspond to the workpiece models, respectively; a sixth process of performing a three-dimensional search process using the multiple created workpiece models with respect to the three-dimensionally measured data obtained by the three-dimensional measurement; and a seventh process of controlling an operation of the holding unit of the robot so as to hold the workpiece model succeeded in the three-dimensional search process based on the holding data corresponding to the workpiece model succeeded in the three-dimensional search process by the sixth process.

According to the image processing method of a fifth aspect of the present invention, the second process in the fourth aspect of the present invention may include: an eighth process of receiving setting of a threshold value in a height direction in the set model coordinate system; and a ninth process of setting a region having information about a height equal to or lower than the threshold value in the height direction as the background region portion.

According to the image processing method of a sixth aspect of the present invention, the third process in the fourth or fifth aspect of the present invention may set the model coordinate system of the workpiece model based on shape information indicating a shape of the created workpiece model.

To achieve the object, according to a seventh aspect of the present invention, there is provided a computer program capable of being performed by an image processing device which controls a picking operation of a robot in which the robot holds workpieces loaded in bulk with a holding unit and moves a held workpiece to a predetermined position, the computer program causing the image processing device to serve as: a sensing unit that obtains three-dimensionally measured data by performing a three-dimensional measurement on a working space in which the workpieces are loaded in bulk; a workpiece model creating unit that creates a workpiece model indicating a shape of the workpiece, except for a background region portion of the workpiece, based on the three-dimensionally measured data obtained by the three-dimensional measurement; a coordinate system setting unit that sets a model coordinate system of the created workpiece model; a holding data setting unit that sets holding data, as relative position data in the set model coordinate system, including a holding position of the workpiece model and a posture of the holding unit of the robot when holding the holding position; a holding data storage unit that repeats setting of the model coordinate system and setting of the holding data with respect to multiple workpiece models created based on the three-dimensionally measured data obtained by the three-dimensional measurement while sequentially changing the posture of the workpiece, and stores multiple pieces of holding data such that the multiple pieces of holding data correspond to the workpiece models; a search process performing unit that performs a three-dimensional search process using the multiple created workpiece models with respect to the three-dimensionally measured data obtained by the three-dimensional measurement; and a control unit that controls an operation of the holding unit of the robot so as to hold the workpiece model succeeded in the three-dimensional search process based on the holding data corresponding to the workpiece model succeeded in the three-dimensional search process by the search process performing unit.

According to a computer program according to an eighth aspect of the present invention, the computer program according to the seventh aspect of the present invention may cause the workpiece model creating unit to serve as: a setting receiving unit that receives setting of a threshold value in a height direction in the set model coordinate system; and a background region adjusting unit that sets a region having information about a height equal to or lower than the threshold value in the height direction as the background region portion.

According to a ninth aspect of the present invention, the computer program according to the seventh or eighth aspect of the present invention may cause the coordinate system setting unit to serve as a unit that sets the model coordinate system of the workpiece model based on shape information indicating a shape of the created workpiece model.

In the first, the fourth, or the seventh aspect of the present invention, the three-dimensionally measured data are obtained by performing the three-dimensional measurement on the working space in which the workpieces are loaded in bulk, and the workpiece model indicating the shape of the workpiece, except for the background region portion of the workpiece, is created based on the obtained three-dimensionally measured data. The model coordinate system of the created workpiece model is set, and the holding data including the holding position of the workpiece model and the posture of the holding unit of the robot when holding the holding position are set as relative position data in the set model coordinate system. The setting of the model coordinate system and the setting of the holding data are repeated with respect to each of the multiple workpiece models created based on the three-dimensionally measured data obtained by the three-dimensional measurement while sequentially changing the posture of the workpiece, and the multiple holding data are stored so that the multiple holding data correspond to the workpiece models, respectively. The three-dimensional search process is performed using the multiple created workpiece models with respect to the three-dimensionally measured data obtained by the three-dimensional measurement, and the operation of the holding unit of the robot is controlled so as to hold the workpiece model succeeded in the three-dimensional search process based on the holding data corresponding to the workpiece model succeeded in the three-dimensional search process. Therefore, even though no CAD data of the workpiece are present, it is possible to register the workpiece model of the workpiece, which becomes a holding target of the robot, using the three-dimensionally measured data of the workpiece which is actually and three-dimensionally measured. In addition, since the model coordinate system is set with respect to the workpiece and the holding position is set relative to the model coordinate system, it is possible to perform the operation without registering the image, which becomes a master, and the holding position again unlike the related art even though the relative positional relationship between the image capturing unit and the robot is changed. Further, since the origin of the workpiece, which becomes the holding target, may be freely set, it is possible to register the holding posture and the workpiece model for the three-dimensional search process by extracting only a common shape in the case in which the multiple common shapes are present like the "joint". As a result, it is possible to perform the setting with a high degree of freedom and to efficiently and simply perform the teaching of the holding posture.

In the second, the fifth, or the eighth aspect of the present invention, the setting of the threshold value in the height direction in the set model coordinate system is received, and the region having information about the height equal to or lower than the threshold value in the height direction is set as the background region portion. As a result, it is possible to adjust the background region portion excluded from the target for the three-dimensional search process and to search the part to be reliably held even though the workpiece has the multiple parts which become the holding targets.

In the third, the sixth, or the ninth aspect of the present invention, the model coordinate system of the workpiece model is set based on the shape information indicating the shape of the created workpiece model. As a result, it is possible to change the origin of the model coordinate system in accordance with the shape of the workpiece model, and to more reliably guide the holding unit of the robot to a position where the holding unit is capable of holding the workpiece.

According to the present invention, even though no CAD data of the workpiece are present, it is possible to register the workpiece model of the workpiece, which becomes the holding target of the robot, by using the three-dimensionally measured data of the workpiece which is actually and three-dimensionally measured. In addition, the model coordinate system is set with respect to the workpiece, and the holding position is set relative to the model coordinate system, and as a result, it is possible to perform the operation without registering the image, which is a master, and the holding position again unlike the related art even though the relative positional relationship between the image capturing unit and the robot is changed. Further, the origin of the workpiece, which becomes a holding target, may be freely set, and thus it is possible to register the holding posture and the workpiece model for the three-dimensional search process by extracting only a common shape in a case in which the multiple common shapes are present like the "joint", and as a result, it is possible to perform the setting with a high degree of freedom and to efficiently and simply perform the teaching of the holding posture.

BRIEF DESCRIPTION OF THE DRAWINGS

FIGS. 13A to 13F are views each illustrating an example of a height image of the workpiece using actually measured data of the image processing device according to the exemplary embodiment of the present invention;

DESCRIPTION OF EMBODIMENTS

Hereinafter, an image processing device according to an exemplary embodiment of the present invention will be described in detail with reference to the drawings. In the present exemplary embodiment, the image processing device is used to control an operation of a holding unit of a robot in a picking operation of the robot.

Figure 1:
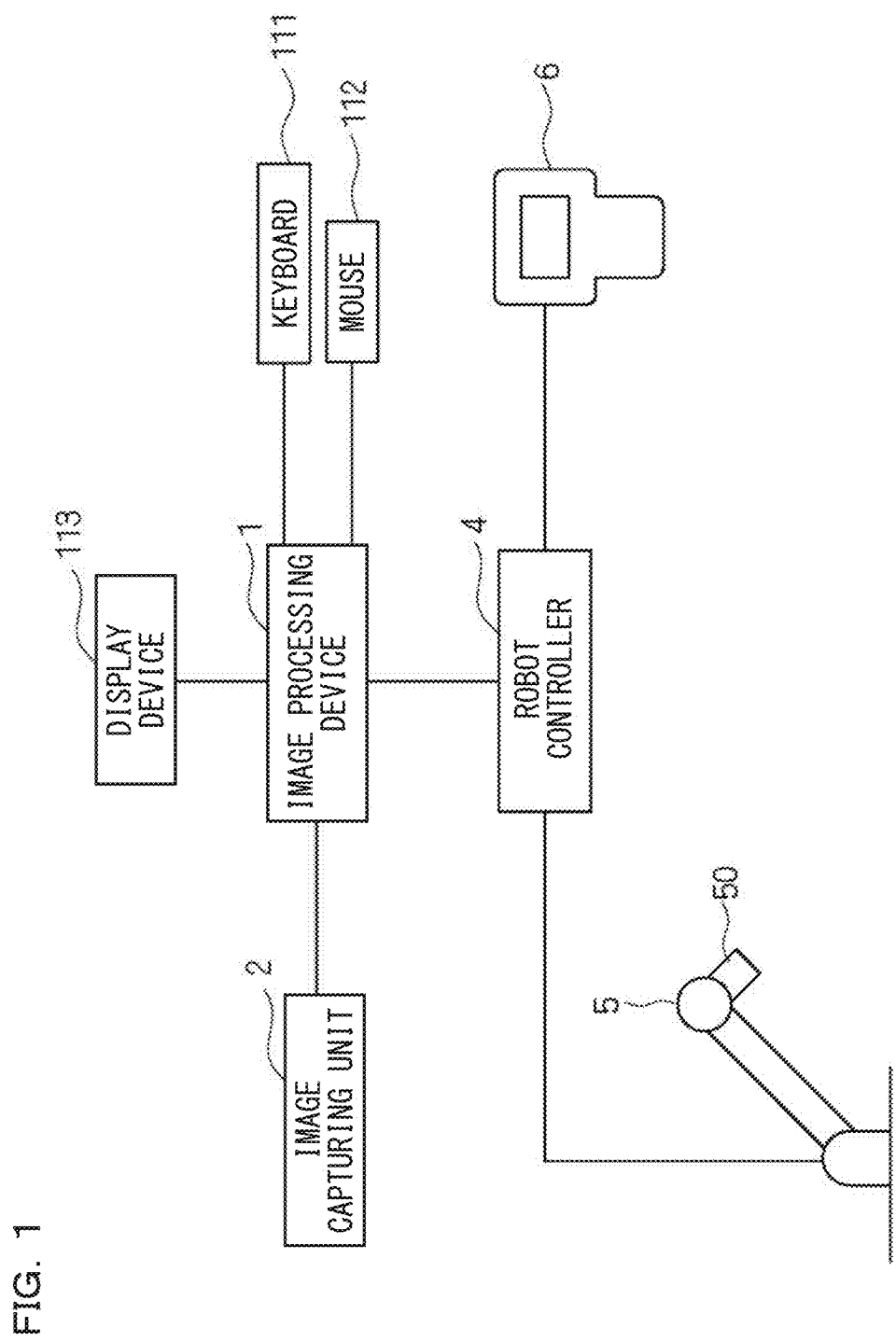
FIG. 1 is a block diagram illustrating a configuration example of a picking system using an image processing device according to an exemplary embodiment of the present invention.

FIG. 1 is a block diagram illustrating a configuration example of a picking system using an image processing device according to an exemplary embodiment of the present invention. An image capturing unit 2 for capturing images of workpieces loaded in bulk, is connected to an image processing device 1, as a sensing unit, and the setting of an image processing is performed by input devices such as a keyboard 111 and a mouse 112 such that the setting or an operational state may be monitored through a display device 113.

Figure 2:
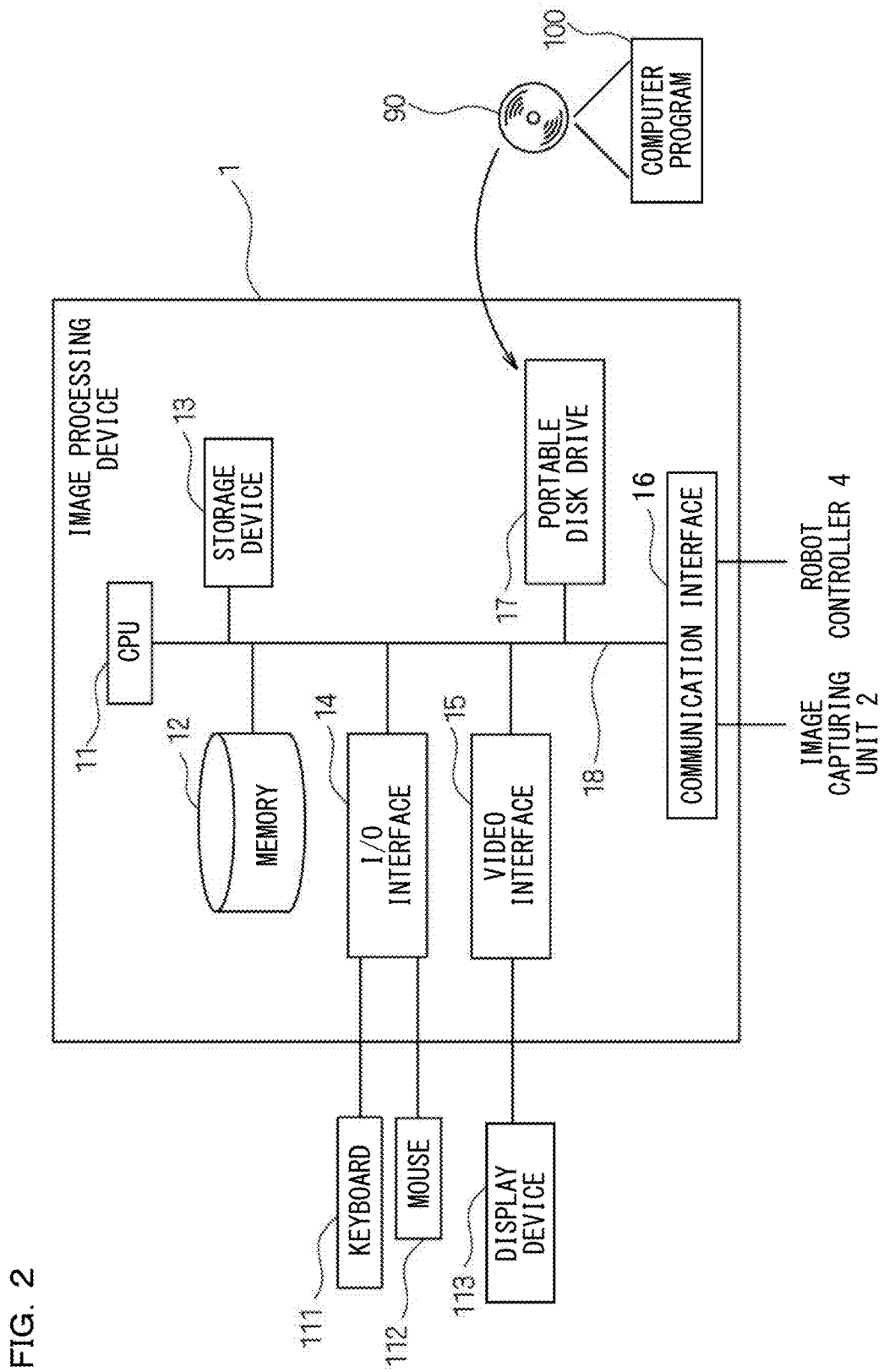
FIG. 2 is a block diagram illustrating a configuration of the image processing device according to the exemplary embodiment of the present invention.

FIG. 2 is a block diagram illustrating a configuration of the image processing device 1 according to the exemplary embodiment of the present invention. As illustrated in FIG. 2, the image processing device 1 according to the present exemplary embodiment at least includes a CPU 11, a memory 12, a storage device 13 such as a hard disk, an I/O interface 14, a video interface 15, a communication interface 16, a portable disk drive 17, and an inner bus 18 which interconnects the aforementioned hardware devices.

The CPU 11 is connected to the respective hardware devices of the image processing device 1 through the inner bus 18 so as to control the operations of the hardware devices, and performs various software functions in accordance with a computer program 100 stored in the storage device 13. The memory 12 is configured with a volatile memory such as an SRAM and an SDRAM, and a load module is deployed at the time of execution of the computer program 100 to store temporary data or the like generated at the time of execution of the computer program 100.

The storage device 13 is configured with an internal stationary storage device (hard disk), a ROM, or the like. The computer program 100 stored in the storage device 13 is downloaded by the portable disk drive 17 from a portable recording medium 90 such as a DVD, a CD-ROM, or the like that stores information such as programs and data, and the computer program 100 is executed by being deployed to the memory 12 from the storage device 13 when the computer program 100 is executed. Of course, the computer program may be a computer program downloaded from an external computer connected to a network through the communication interface 16.

The I/O interface 14 is connected to an input device such as the keyboard 111 and the mouse 112 so as to receive an input of data. In addition, the video interface 15 is connected to the display device 113 such as a CRT monitor or an LCD, and displays setting data of the image processing device 1, an operational state of the robot, and the like.

The communication interface 16 is connected to the inner bus 18 and connected to an external network such as the Internet, a LAN, or a WAN, such that the communication interface 16 may transmit/receive data to/from a robot controller 4, the image capturing unit 2, the external computer, and the like.

Figure 3:
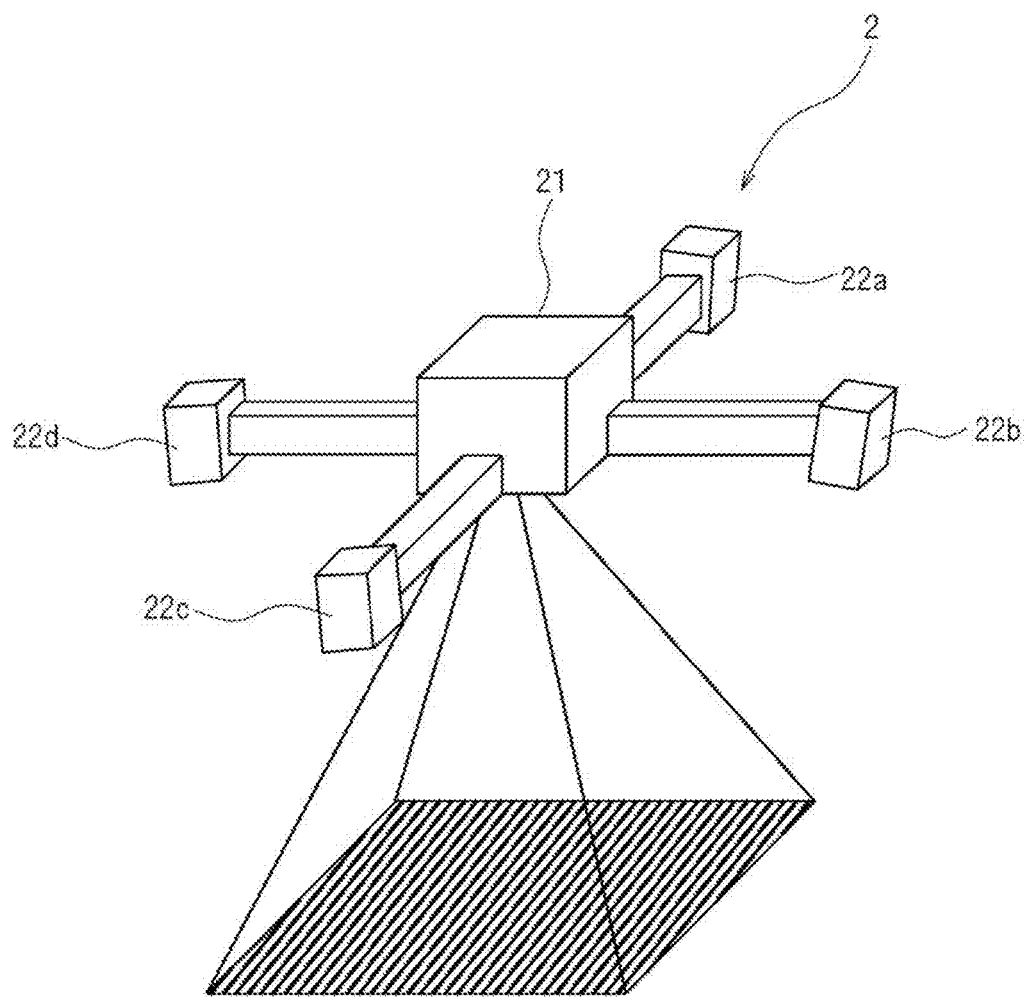
FIG. 3 is a view illustrating an example of a configuration of an image capturing unit of the image processing device according to the exemplary embodiment of the present invention.

Referring back to FIG. 1, the image capturing unit 2 three-dimensionally captures images of workpieces loaded in bulk in a working space. FIG. 3 is a view illustrating an example of a configuration of the image capturing unit 2 of the image processing device 1 according to the exemplary embodiment of the present invention.

As illustrated in FIG. 3, the image capturing unit 2 according to the present exemplary embodiment is provided with a total of four cameras 22a to 22d, one for each side among front, rear, left, and right sides, based on a single projector 21. Therefore, without depending on the states of the workpieces loaded in bulk, it is possible to obtain three-dimensional data for recognizing positions and postures of the respective workpieces in the working space without forming a dead angle. Of course, it is sufficient if the number of cameras 22 is two or more, and the three-dimensional data may be produced only by a configuration having the cameras 22 except for the projector 21.

In the present exemplary embodiment, the projector 21 projects a stripe-shaped stripe pattern in order to detect the positions and the postures of the workpieces loaded in bulk. The projector 21 is disposed above the working space in which the workpieces are loaded in bulk.

The light source of the projector 21 may be, for example, a halogen lamp for emitting white light, a white light emitting diode (LED) for emitting white light, or the like. A pattern generating unit (not illustrated) is provided in the vicinity of an emission port so as to create the stripe pattern. For example, the pattern generating unit may be a digital micro-mirror device (DMD), a reflective liquid crystal element (liquid crystal on silicon (LCOS (registered trademark))), a mask, or the like.

The cameras 22a to 22d are disposed at four points in front, rear, left, and right directions about the projector 21. For example, the cameras 22a to 22d are provided with image capturing elements such as a monochrome CCD (charge coupled device) or a CMOS (complementary metal oxide semiconductor) image sensor. A light receiving signal corresponding to an amount of received light is output for each pixel of the image capturing element. Further, an image is created based on the light receiving signal.

Referring back to FIG. 1, the image processing device 1 is connected to the robot controller 4 for controlling the operation of the robot such that the image processing device 1 is capable of performing data communication with the robot controller 4. The operational signal produced by the image processing device 1 is converted into an operational signal for operating a robot 5 by the robot controller 4 so as to control the operation of the robot 5 and the operation of a holding unit 50 of the robot 5.

A pendant 6 is connected to the robot controller 4 to be capable of performing data communication with the robot controller 4, and receives an input of setting data related to the operation of the robot.

Figure 4:
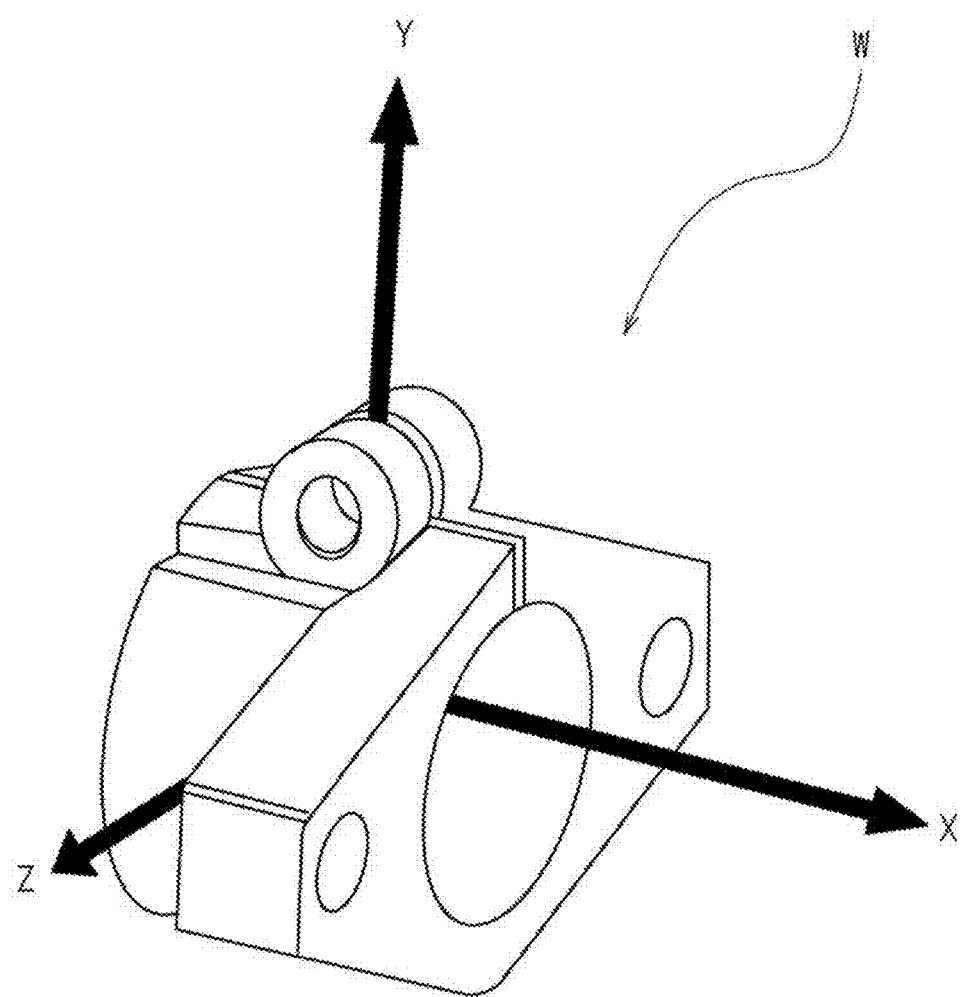
FIG. 4 is a view illustrating an example of a workpiece for a three-dimensional search in the image processing device according to the exemplary embodiment of the present invention.

The operation of the picking system having the aforementioned configuration will be described. FIG. 4 is a view illustrating an example of a workpiece for a three-dimensional search in the image processing device 1 according to the exemplary embodiment of the present invention. Hereinafter, even though the case in which workpieces (shaft holders) W having a shape illustrated in FIG. 4 are loaded in bulk will be described as an example, the shape of the workpiece W is not limited thereto.

Figure 5:
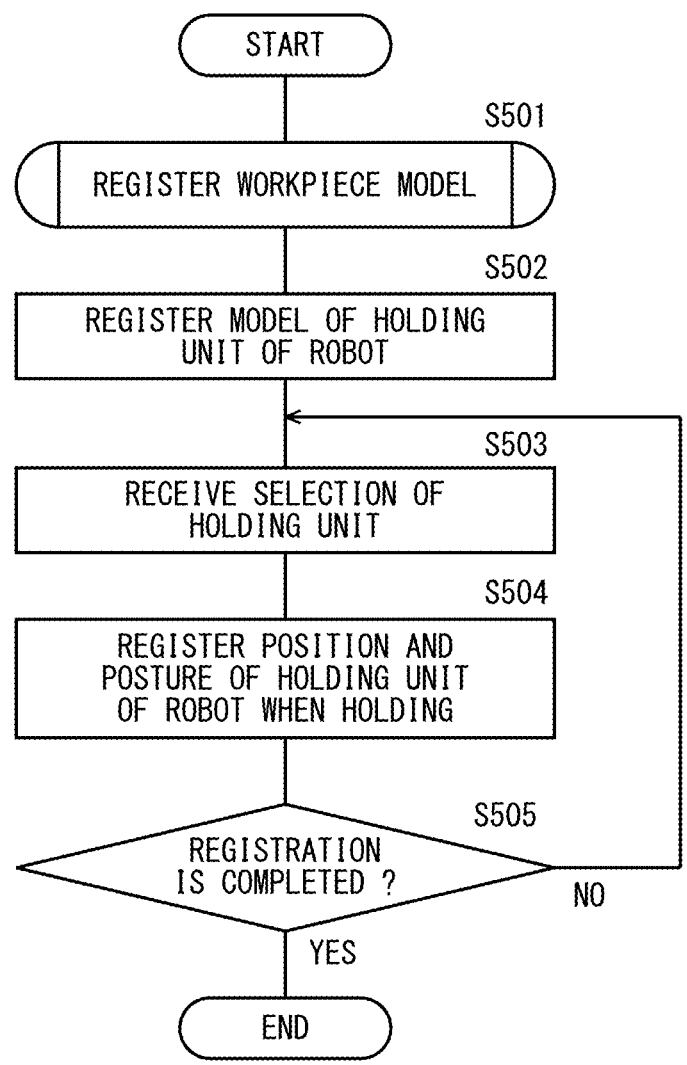
FIG. 5 is a flowchart illustrating a procedure of setting processing of data for a picking operation of a CPU of the image processing device according to the exemplary embodiment of the present invention.

FIG. 5 is a flowchart illustrating a procedure of setting processing of data for a picking operation of the CPU 11 of the image processing device 1 according to the exemplary embodiment of the present invention. As illustrated in FIG. 5, the CPU 11 of the image processing device 1 registers a workpiece model of a workpiece which becomes a target for a search (step S501).

The CPU 11 registers a model of the holding unit 50 of the robot 5 (step S502). In addition to the shape of the holding unit 50, information on which part to hold and in which direction to hold may also be registered.

The CPU 11 receives the selection of the holding unit 50 of the robot 5 (step S503). This is to specify the holding unit 50 used for the actual robot 5. The CPU 11 registers the position and the posture of the holding unit 50 of the robot 5 when holding a target workpiece W (step S504).

The CPU 11 determines whether a user input indicating that the positions and the postures of the holding unit 50 of the robot 5 are registered is received for all of the points of the holding target workpiece W (step S505). When the CPU 11 determines that the user input indicating the registration is not received (step S505: NO), the CPU 11 returns the process back to step S503, and repeats the aforementioned process.

When the CPU 11 determines that the user input indicating the registration is received (step S505: YES), the CPU 11 terminates the process.

A part, which becomes the holding target, is detected by performing a three-dimensional search process on image data obtained by capturing an image of the working space based on the registered workpiece model. In the present exemplary embodiment, a process of extracting characteristic points to be described below is performed in advance with respect to the workpiece model. Further, in the three-dimensional data obtained by capturing the image of the working space, a position and a posture in the state in which X-Y-Z coordinate values of respective characteristic points of the workpiece model are matched by a predetermined degree or higher are obtained by the three-dimensional search process. Whether or not the coordinate values are matched may be determined based on whether or not the three-dimensional data closest to the characteristic points is present in a distance within a predetermined threshold value.

An existence ratio of the matched characteristic points is scored with respect to all of the characteristic points included in the workpiece model, and the scored values calculated together with the position and the posture are calculated as a result of the three-dimensional search process. By excluding a result of the three-dimensional search process in which a scored value is equal to or lower than a predetermined value or setting holding targets in descending order of the scored values, it is possible to guide the holding unit 50 of the robot 5 such that the holding unit 50 is capable of reliably holding the workpiece W while considering the validity of the result of the three-dimensional search process.

Figure 6:
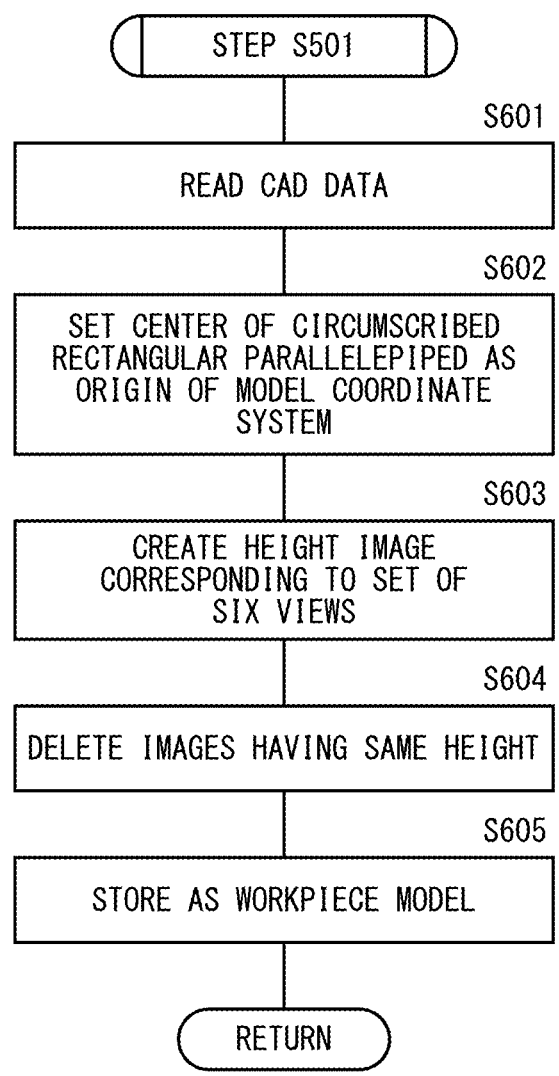
FIG. 6 is a flowchart illustrating a procedure of a workpiece model registration process using CAD data of the CPU of the image processing device according to the exemplary embodiment of the present invention.

In the related art, CAD data are used to register the workpiece model. FIG. 6 is a flowchart illustrating a procedure of a workpiece model registration process (step S501) using CAD data of the CPU 11 of the image processing device 1 according to the exemplary embodiment of the present invention.

In FIG. 6, the CPU 11 of the image processing device 1 reads the CAD data of the workpiece W (step S601), and sets the center of a circumscribed rectangular parallelepiped of the workpiece W as the origin of a model coordinate system (step S602).

The CPU 11 creates height images corresponding to a set of six views (step S603). Specifically, the CPU 11 creates the height images for a front view, a rear view, a top plan view, a bottom view, a right side view, and a left side view.

Figure 7A:
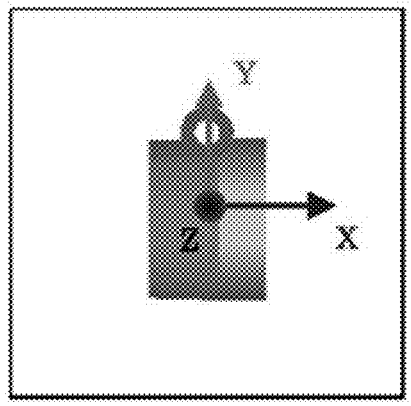
FIGS. 7A to 7F are views each illustrating an example of a height image of the workpiece using the CAD data of the image processing device according to the exemplary embodiment of the present invention.
Figure 7B:
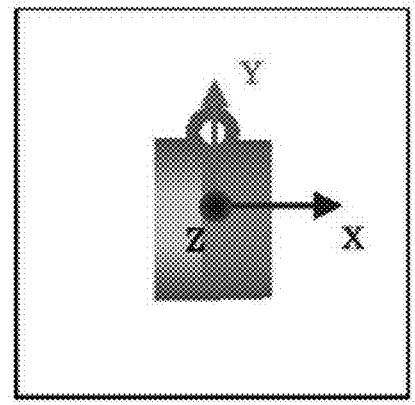
Figure 7C:
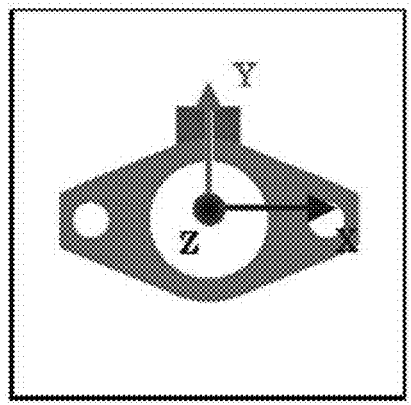
Figure 7D:
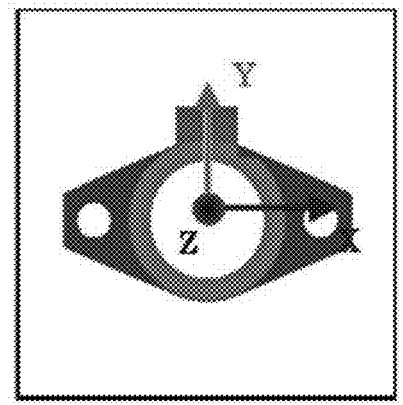
Figure 7E:
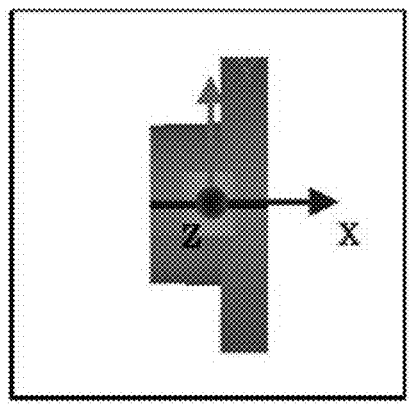
Figure 7F:
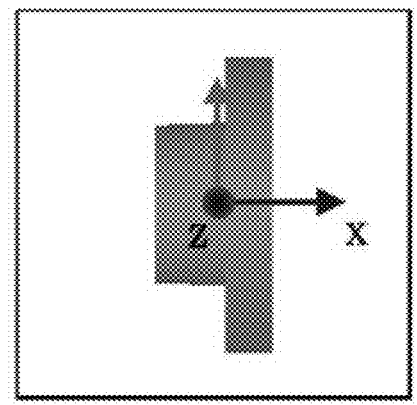

FIGS. 7A to 7F are views each illustrating an example of a height image of the workpiece W using the CAD data of the image processing device 1 according to the exemplary embodiment of the present invention. FIG. 7A illustrates a height image (top plan view) viewed from a plus (+) side of a Z axis illustrated in FIG. 4, FIG. 7B illustrates a height image (bottom view) viewed from a minus (−) side of the Z axis illustrated in FIG. 4, FIG. 7C illustrates a height image (right side view) viewed from a plus (+) side of an X axis illustrated in FIG. 4, FIG. 7D illustrates a height image (left side view) viewed from a minus (−) side of the X axis illustrated in FIG. 4, FIG. 7E illustrates a height image (rear view) viewed from a plus (+) side of a Y axis illustrated in FIG. 4, and FIG. 7F illustrates a height image (front view) viewed from a minus (−) side of the Y axis illustrated in FIG. 4. In FIGS. 7A to 7F, the origin of the coordinate axes is the center of the circumscribed rectangular parallelepiped of the CAD data. The heights may be indicated by respective coordinate values of the X axis, the Y axis, and the Z axis.

Referring back to FIG. 6, the CPU 11 deletes the images having the same height from the created height images (step S604). For example, when a workpiece has a columnar shape, the front view, the rear view, the right side view, and the left side view, which look like a rectangular shape, are the same as each other, and the top plan view and the bottom view, which are shown as an annular shape, are to the same as each other. As a result, the remaining views are deleted except for the front view and the top plan view. The CPU 11 stores (registers) the remaining height images as workpiece models in the storage device 13 (step S605).

Figure 8:
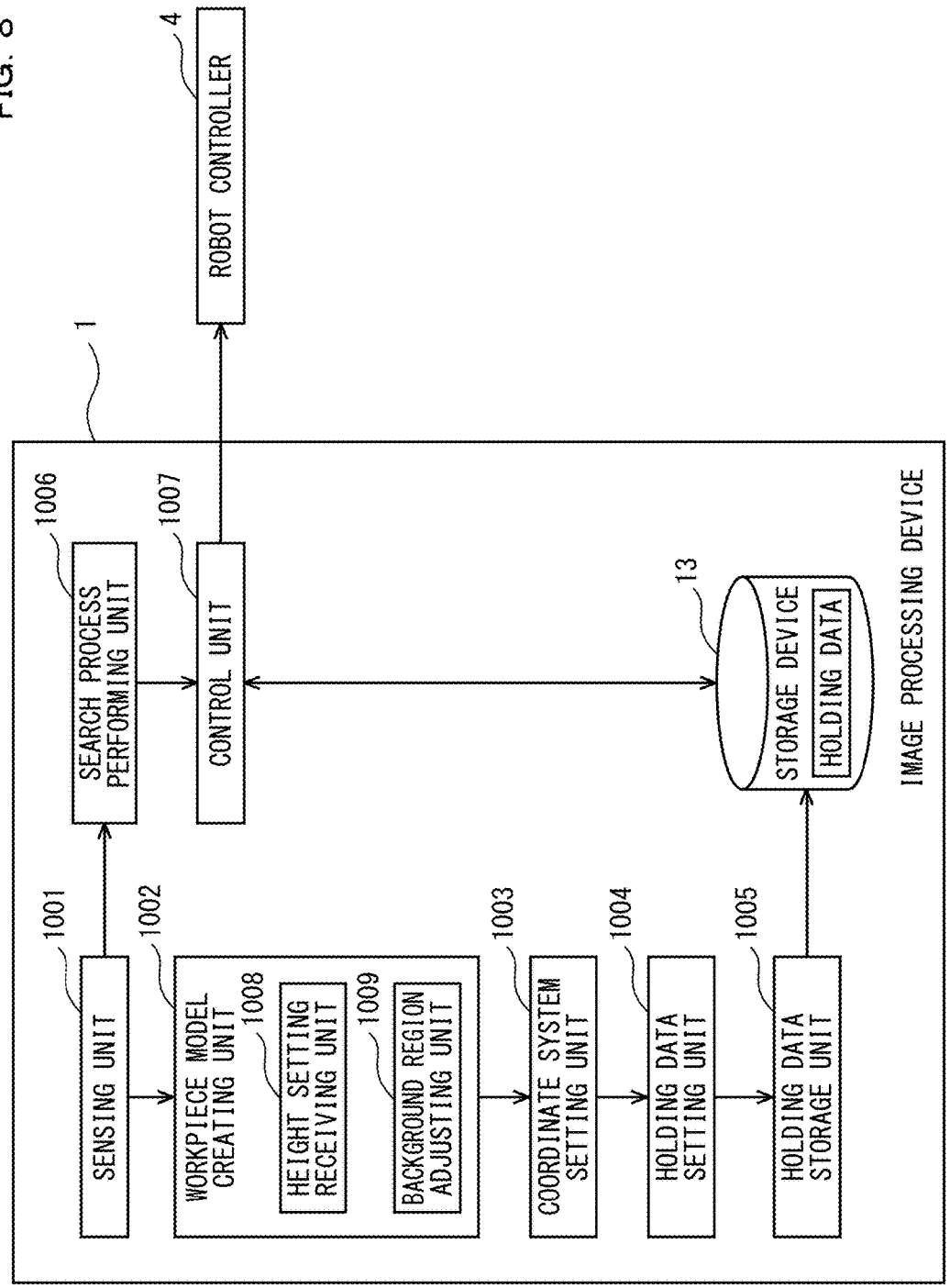
FIG. 8 is a functional block diagram of the image processing device according to the exemplary embodiment of the present invention.

In the present exemplary embodiment, the CAD data are not prepared in advance, and the three-dimensional search is performed by registering the workpiece models which become search targets using actually measured data of the workpiece W. FIG. 8 is a functional block diagram of the image processing device 1 according to the exemplary embodiment of the present invention.

In FIG. 8, a sensing unit 1001 obtains three-dimensionally measured data by performing a three-dimensional measurement on the working space in which workpieces W are loaded in bulk, based on the images captured by the image capturing unit 2. A workpiece model creating unit 1002 creates a workpiece model indicating a shape of the workpiece W except for a background region portion of the workpiece, based on the three-dimensionally measured data obtained by the three-dimensional measurement. The three-dimensional measurement is performed on the workpieces W loaded in bulk during the operation, but the three-dimensional measurement may be performed in the state in which a workpiece W is disposed on a flat surface when creating the workpiece model, but the present invention is not particularly limited thereto.

The workpiece model creating unit 1002 may adjust a background region. For this reason, the workpiece model creating unit is provided with a height setting receiving unit (setting receiving unit) 1008 and a background region adjusting unit 1009.

The height setting receiving unit 1008 receives setting of a threshold value in a height direction in the model coordinate system to be set. Here, the "height" means a height from a background surface. The background region adjusting unit 1009 uses a region having information on a height equal to or less than the threshold value in the height direction, as the background region portion. Therefore, the background surface may be changed in the height direction, and the created workpiece model may be changed.

A coordinate system setting unit 1003 sets the model coordinate system of the created workpiece model. The coordinate system setting unit 1003 may set the coordinate system based on shape information indicating the shape of the created workpiece model, rather than uniformly defining the coordinate system like the CAD data. A holding data setting unit 1004 sets holding data including the holding position and the posture of the holding unit 50 of the robot 5 which performs the holding operation at the holding position, as relative position data with respect to the model coordinate system set by the coordinate system setting unit 1003.

A holding data storage unit 1005 repeats the setting of the model coordinate system and the setting of the holding data with respect to the multiple created workpiece models based on the three-dimensionally measured data obtained by the three-dimensional measurement while sequentially changing the posture of the workpiece W, and stores the multiple pieces of holding data in the storage device 13 such that the holding data correspond to the workpiece models.

A search process performing unit 1006 performs a three-dimensional search process using the multiple created workpiece models with respect to the three-dimensionally measured data of the workpieces W loaded in bulk which are obtained by performing the three-dimensional measurement on the working space. A control unit 1007 transmits, to the robot controller 4, a control signal for controlling the operation of the holding unit 50 of the robot 5 based on the holding data set to a workpiece model the presence of which is confirmed. The robot coordinate required for controlling the operation of the holding unit 50 of the robot 5 may be obtained from a coordinate system on a vision space obtained by the image capturing unit 2 by performing calibration in advance by the method disclosed in JP-A-2016-120567 or the like.

Figure 9:
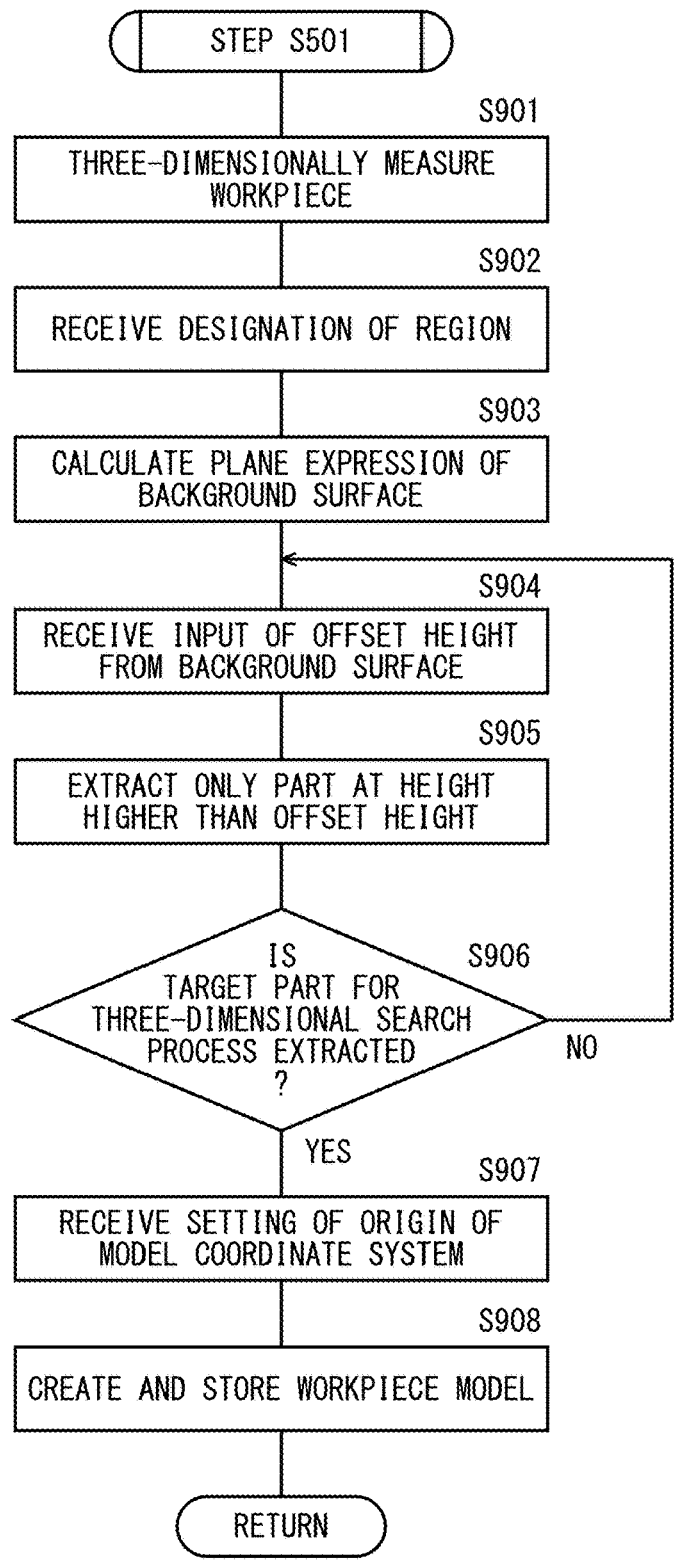
FIG. 9 is a flowchart illustrating a procedure of a registering process of a workpiece model which is a target for a search using actually measured data of the CPU of the image processing device according to the exemplary embodiment of the present invention.

Hereinafter, a detailed description will be made using a flowchart. FIG. 9 is a flowchart illustrating a procedure of a registering process (step S501) of a workpiece model which becomes a search target using actually measured data of the CPU 11 of the image processing device 1 according to the exemplary embodiment of the present invention.

In FIG. 9, the CPU 11 of the image processing device 1 obtains the three-dimensionally measured data by performing the three-dimensional measurement on the workpiece (step S901). The CPU 11 receives designation of a region by a user for designating the workpiece which becomes a registration target (step S902). The CPU 11 calculates a plane expression for the background surface based on the three-dimensionally measured data (step S903).

The CPU 11 receives an input of an offset height (the threshold value in the height direction) from the background surface (step S904), and extracts only a part higher than the offset height (step S905). The CPU 11 determines whether or not an input indicating that a target part of the three-dimensional search process is extracted is received (step S906).

When the CPU 11 determines that the input indicating that the target part of the three-dimensional search process is extracted is not received (step S906: NO), the CPU 11 returns the process back to step S904 and repeats the aforementioned process in order to change the extracted part. When the CPU 11 determines that the input indicating that the target part of the three-dimensional search process is extracted is received (step S906: YES), the CPU 11 receives the setting of the origin of the model coordinate system (step S907).

A process of extracting a part of the holding target, that is, a background separating process based on the background surface may, for example, obtain the plane expression of the background surface by applying a least-squares method using the three-dimensionally measured data on a region frame line (a frame 61 in FIGS. 10A and 10B to be described below) designated by the user during the process in step S902. When the region is set to surround the workpiece which becomes a registration target, since the data on the region frame line are only the data only for the background surface, it is possible to obtain a stable plane expression by the least-squares method. However, the background separating process is not limited thereto, but various methods may be applied.

Figure 10A:
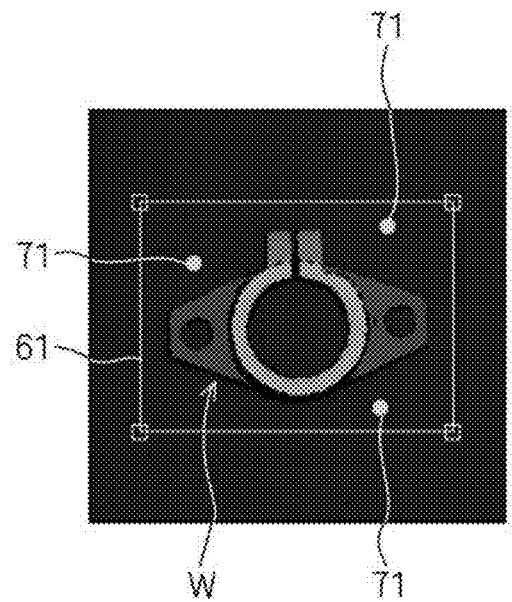
FIGS. 10A and 10B are views illustrating an example of designation of a background surface of the image processing device according to the exemplary embodiment of the present invention.
Figure 10B:
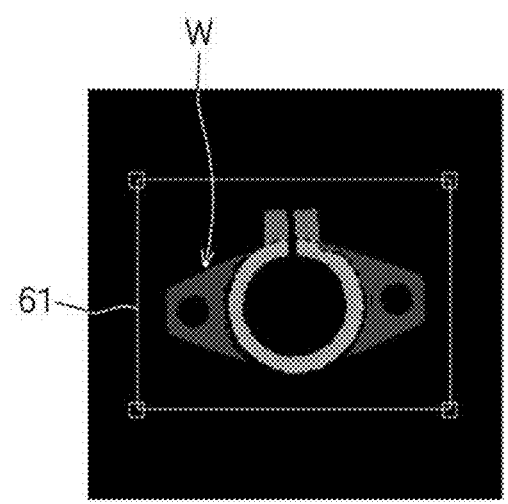

For example, the background surface may be specified by receiving designation of three points by which a surface may be specified on the background surface. FIGS. 10A and 10B are views illustrating an example of the designation of the background surface of the image processing device 1 according to the exemplary embodiment of the present invention. FIG. 10A is a view illustrating an example of reception of the designation of the background surface in the top plan view of the workpiece W, and FIG. 10B is a view illustrating a state after the background separating process (after the extraction of the workpiece model) in the top plan view of the workpiece W.

As illustrated in FIG. 10A, the background surface is uniquely specified by receiving designation of three points 71, 71, and 71 indicating the background. By separating a part at a height equal to or lower than a predetermined height with respect to the specified background surface as the background, it is possible to extract the holding target part of the workpiece W as illustrated in FIG. 10B. Of course, since it is sufficient if the three points for receiving the designation are on the same plane, there may be three points in the frame 61, or a point outside the frame 61 may be included.

Figure 11A:
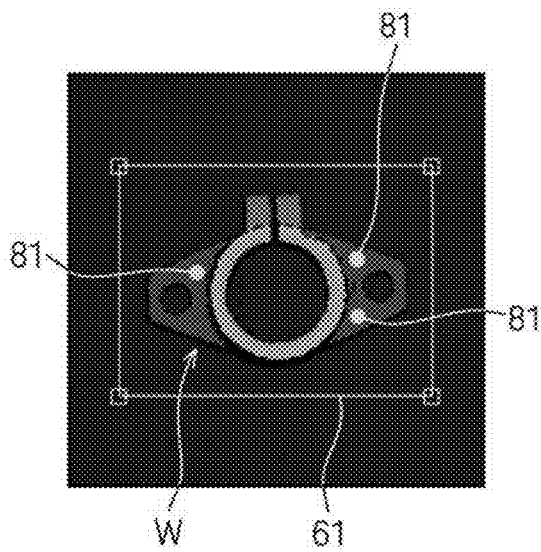
FIGS. 11A and 11B are views illustrating an example of designation of parts of a workpiece of the image processing device according to the exemplary embodiment of the present invention.
Figure 11B:
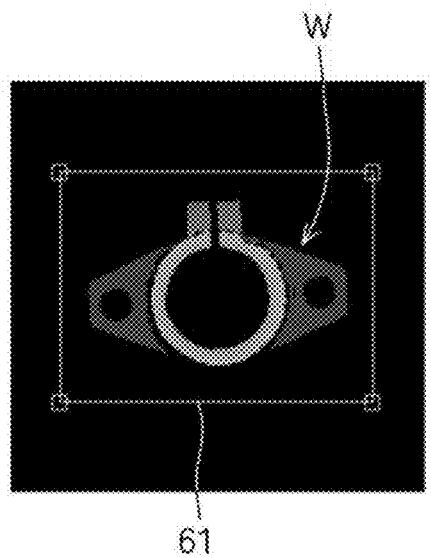

Designation of three points of the part to be extracted may be received. FIGS. 11A and 11B are views illustrating an example of designation of parts of the workpiece W of the image processing device 1 according to the exemplary embodiment of the present invention. FIG. 11A is a view illustrating an example of reception of designation of a surface of a part of an extraction target in the top plan view of the workpiece W, and FIG. 11B is a view illustrating a state after extracting the workpiece model (after the background separating process) in the top plan view of the workpiece W.

As illustrated in FIG. 11A, the surface of the part of the workpiece W to be extracted is uniquely specified by receiving the designation of three points 81, 81, and 81 indicating a surface of a part of the workpiece W to be extracted. By separating a part at a height equal to or lower than a predetermined height with respect to the surface of the specified part as the background, it is possible to extract the holding target part of the workpiece W, as illustrated in FIG. 11B.

The background surface may be obtained by applying the least-squares method with respect to the three-dimensionally measured data outside the frame, not inside the region frame (the frame 61 in FIGS. 10A and 10B) designated by the user. The background surface may be specified on the assumption that only a single workpiece is disposed on a plane within a visual field.

Figure 12A:
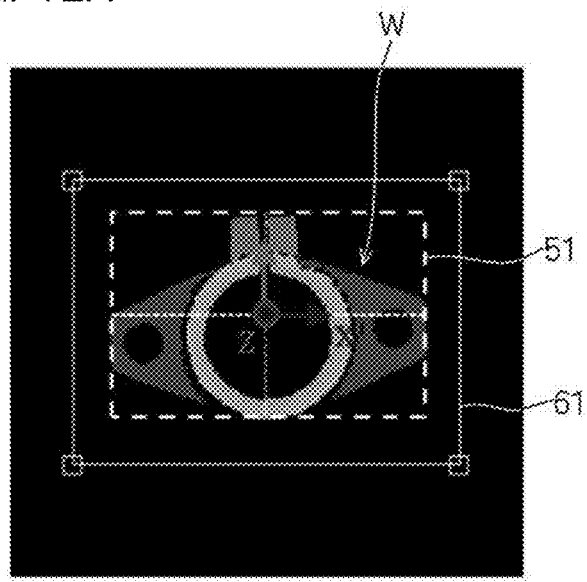
FIGS. 12A and 12B are views illustrating an example of setting an origin of a coordinate system of the image processing device according to the exemplary embodiment of the present invention.
Figure 12B:
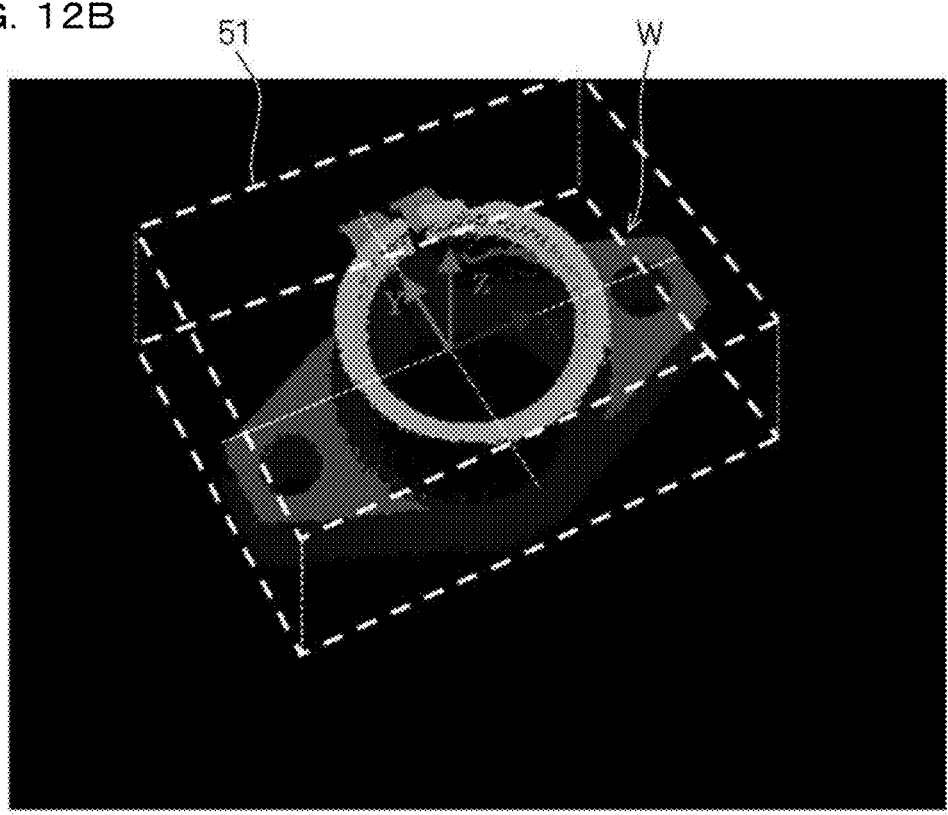

FIGS. 12A and 12B are views illustrating an example of setting of an origin of a coordinate system of the image processing device 1 according to the exemplary embodiment of the present invention. FIG. 12A is a view illustrating an example of setting of coordinate axes in a height image obtained by actually performing a 3D measurement on a surface (left side view) viewed from the minus (−) side of the X axis of the workpiece W illustrated in FIG. 4, and FIG. 12B is a view illustrating an example of a 3D display including the model coordinate system of the workpiece W. The X axis, the Y axis, and the Z axis in the height image of FIG. 12A are different from the X axis, the Y axis, and the Z axis of the CAD data illustrated in FIG. 4, and a direction immediately above the height image is set to the Z-axis direction. In other words, the direction of the minus (−) side of the X axis of the CAD data illustrated in FIG. 4 is set to the Z-axis direction in the height image of FIG. 12A.

For example, as illustrated in FIG. 12A, a circumscribed rectangle 51, which is circumscribed about the workpiece W in the frame 61 in a plane perpendicular to the Z axis in the height image, is specified, and the center of the circumscribed rectangle 51 is set to the center position of the Z axis. Similarly, By also setting center positions set in the X-axis direction and the Y-axis direction, it is possible to set the origin of the model coordinate system, as illustrated in FIG. 12B. This is different from the case in which the CAD data are used in that the origin of the model coordinate system is capable of being changed in accordance with shape information indicating the shape of the extracted part, as described above.

Referring back to FIG. 9, the CPU 11 creates the part of the extracted workpiece W in the frame 61 as the workpiece model, and stores (registers) the part of the extracted workpiece W in the storage device 13 (step S908). FIGS. 13A to 13F are views each illustrating an example of a height image of the workpiece W using actually measured data of the image processing device 1 according to the exemplary embodiment of the present invention. FIG. 13A illustrates the height image (top plan view) viewed from the plus (+) side of the Z axis illustrated in FIG. 4, FIG. 13B illustrates the height image (bottom view) viewed from the minus (−) side of the Z axis illustrated in FIG. 4, FIG. 13C illustrates the height image (right side view) viewed from the plus (+) side of the X axis illustrated in FIG. 4, FIG. 13D illustrates the height image (left side view) viewed from the minus (−) side of the X axis illustrated in FIG. 4, FIG. 13E illustrates the height image (rear view) viewed from the plus (+) side of the Y axis illustrated in FIG. 4, and FIG. 13F illustrates the height image (front view) viewed from the minus (−) side of the Y axis illustrated in FIG. 4.

As illustrated in FIGS. 13A to 13F, in the present exemplary embodiment, only the part of the workpiece W present at a position higher than the background surface by a predetermined degree or higher in the region of which the designation by the user is received is extracted.

Figure 14A:
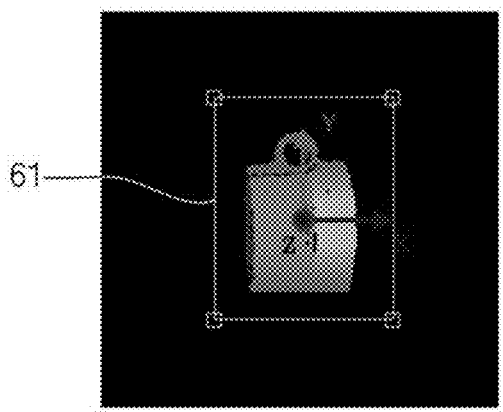
FIGS. 14A to 14F are views each illustrating an example of a workpiece model using actually measured data of the image processing device according to the exemplary embodiment of the present invention.
Figure 14B:
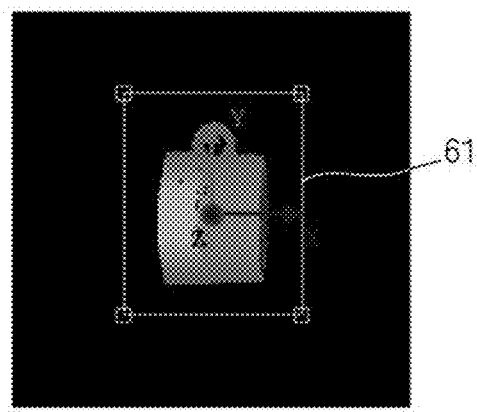
Figure 14C:
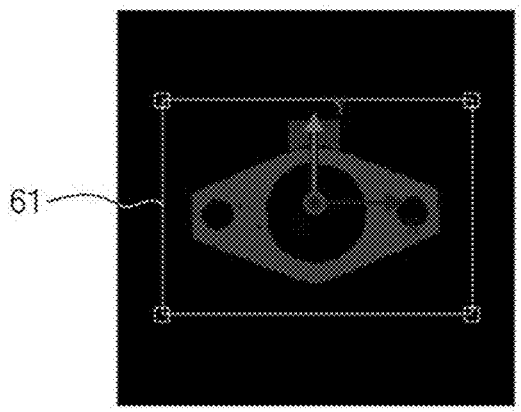
Figure 14D:
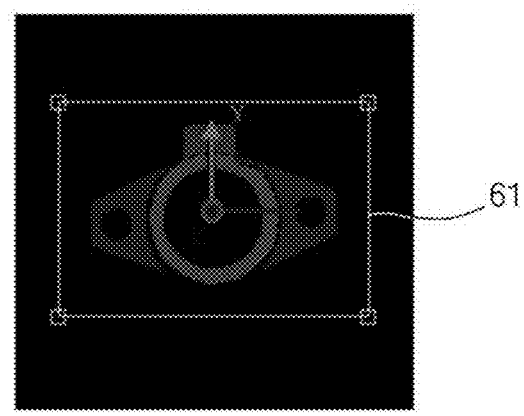
Figure 14E:
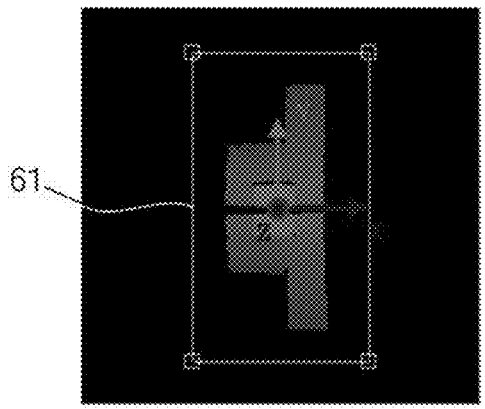
Figure 14F:
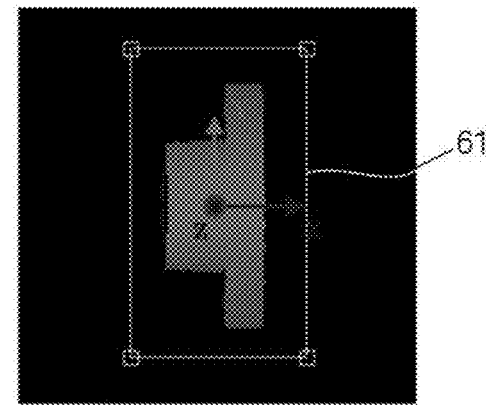

FIGS. 14A to 14F are exemplified views of a workpiece model using actually measured data of the image processing device 1 according to the exemplary embodiment of the present invention. FIG. 14A illustrates a workpiece model (top plan view) viewed from the plus (+) side of the Z axis illustrated in FIG. 4, FIG. 14B illustrates a workpiece model (bottom view) viewed from the minus (−) side of the Z axis illustrated in FIG. 4, FIG. 14C illustrates a workpiece model (right side view) viewed from the plus (+) side of the X axis illustrated in FIG. 4, FIG. 14D illustrates a workpiece model (left side view) viewed from the minus (−) side of the X axis illustrated in FIG. 4, FIG. 14E illustrates a workpiece model (rear view) viewed from the plus (+) side of the Y axis illustrated in FIG. 4, and FIG. 14F illustrates a workpiece model (front view) viewed from the minus (−) side of the Y axis illustrated in FIG. 4.

As illustrated in FIGS. 14A to 14F, in the present exemplary embodiment, the workpiece model is created only for the part of the workpiece W present at a position at a height equal to or higher than a predetermined offset height from the background surface in the frame 61. This is from the case in which the CAD data are used in that the user is capable of setting the origin of the model coordinate system. Therefore, an optimum model coordinate system may be set in accordance with the shape of the part which becomes a target for the three-dimensional search.

The method of the related art disclosed in JP-A-2016-120567, in which a holding position is set using a workpiece an image of which is actually captured without using CAD data, stores an image of a position for holding a workpiece and a position coordinate of the robot to correspond to each other. As a result, when the positional relationship between the image capturing unit and the robot is changed, it is necessary to correct again and register the image of the position for holding the workpiece and the position coordinate of the robot. That is, in the existing method in which a registration is performed based on an absolute positional relationship, it is necessary to repeatedly perform the registration operation each time when the relative positional relationship between the image capturing unit and the robot is changed.

Meanwhile, in the present invention, with respect to the model coordinate system for each workpiece, the holding position is registered at a relative position with respect to the model coordinate system. Thus, it is possible to use the holding position without registering the holding position again even if the positional relationship between the image capturing unit and the robot is changed. When picking all of the workpieces loaded in bulk, the registration of the holding position may be complicated in some instances depending on the workpieces. For example, even if the picking process by the robot is deployed in a separate line, the merit of diverting once registered holding position data of the holding position is great.

The workpiece model may be created by a cluster of characteristic points from which an unnecessary background image is deleted. The characteristic points mean points having three-dimensional coordinates indicating necessary characteristics in the three-dimensional search process, and for example, the characteristic points may be configured with two types of characteristic points including a characteristic point on a contour which indicates a contour of a shape and a characteristic point on a surface which indicates a surface shape.

Figure 15A:
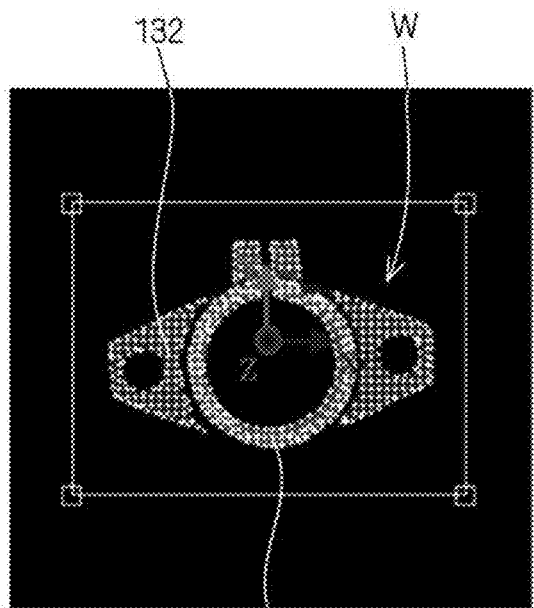
FIGS. 15A and 15B are views illustrating an example of extracting a characteristic point of the workpiece model of the image processing device according to the exemplary embodiment of the present invention.
Figure 15B:
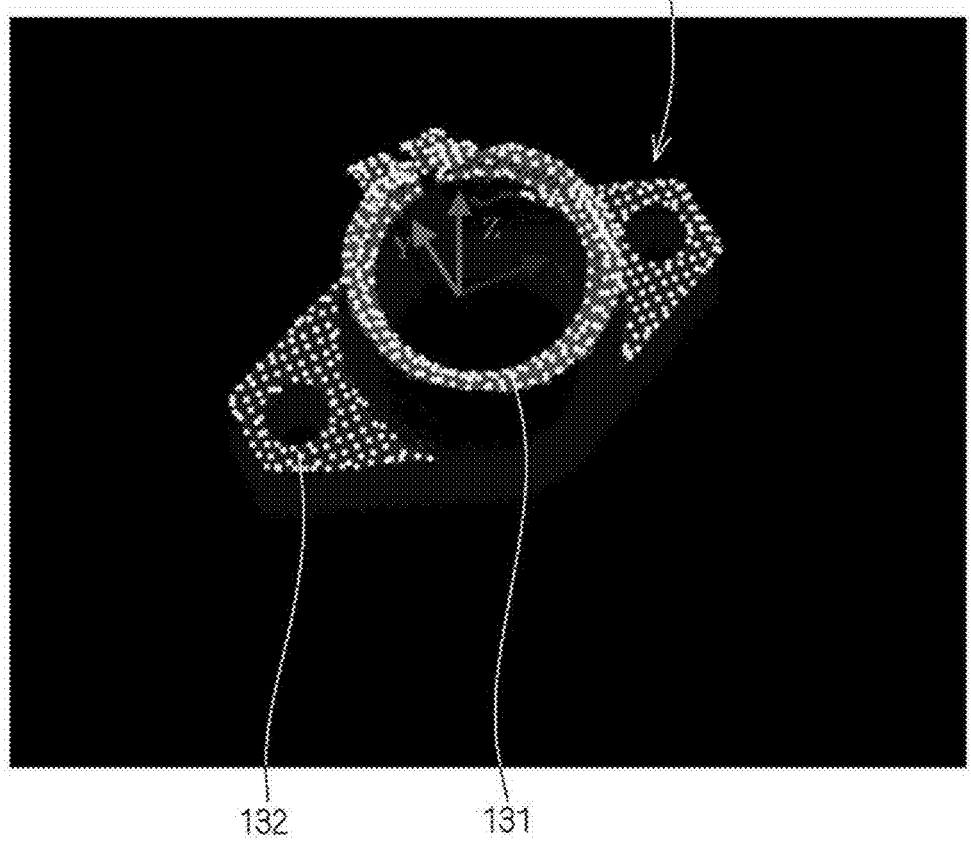

FIGS. 15A and 15B are views illustrating an example of extraction of a characteristic point of the workpiece model of the image processing device 1 according to the exemplary embodiment of the present invention. FIG. 15A is a view illustrating an example of extraction of the characteristic point in the top plan view of the workpiece W, and FIG. 15B is a view illustrating an example of a 3D display of extraction of the characteristic point including the model coordinate system of the workpiece W.

For example, as illustrated in FIG. 15A, edge extraction is performed in a portion, the height of which is greatly changed, or the like, and portions, which are subjected to a line thinning process, are extracted at a predetermined interval. In addition, the characteristic points 132 on the surface are extracted at a predetermined interval in the surface of the workpiece model. Therefore, this is displayed in 3D display as illustrated in FIG. 15B.

Figure 16:
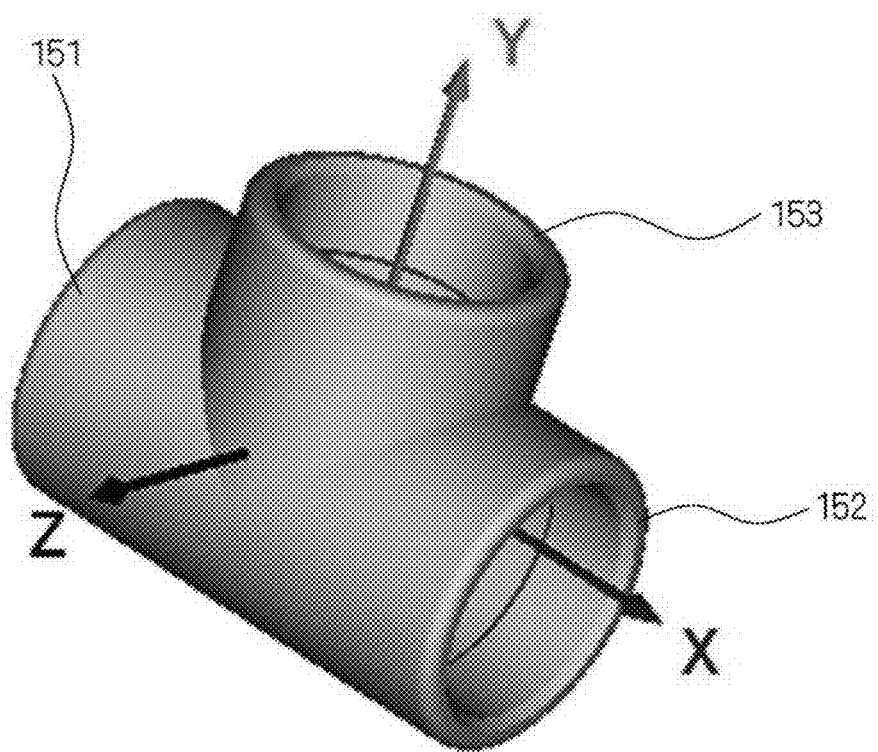
FIG. 16 is a view illustrating an example of a workpiece of a joint having holes which are provided at multiple points and may be held by a holding unit of a robot.

A simple example will be described as to how a workpiece model extracted by an input of the offset height (the threshold value in the height direction) from the background surface is changed with respect to a captured height image of a workpiece W. FIG. 16 is a view illustrating an example of a workpiece W of a joint having holes 151, 152, and 153 which are provided at multiple points and may be held by the holding unit of the robot.

In the example illustrated in FIG. 16, since multiple parts having common shapes are present in the workpiece W and the multiple parts look similar to each other even if the postures thereof are changed, a posture in a three-dimensional search process is likely to fall into an error. In the case in which the workpiece W becomes the holding target, it is possible to efficiently perform the setting and stably perform the operation by holding the workpiece W by performing a three-dimensional search process on the hole portions having the common shape, rather than designating holding positions one by one for respective hole portions having the common shape.

Figure 17A:
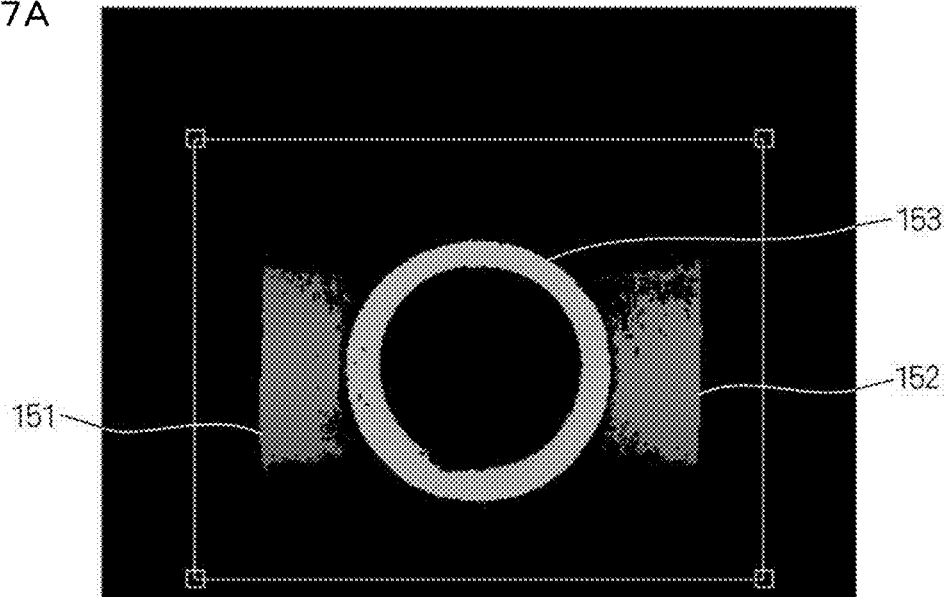
FIGS. 17A and 17B are views each illustrating an example of a height image of the workpiece of the joint.
Figure 17B:
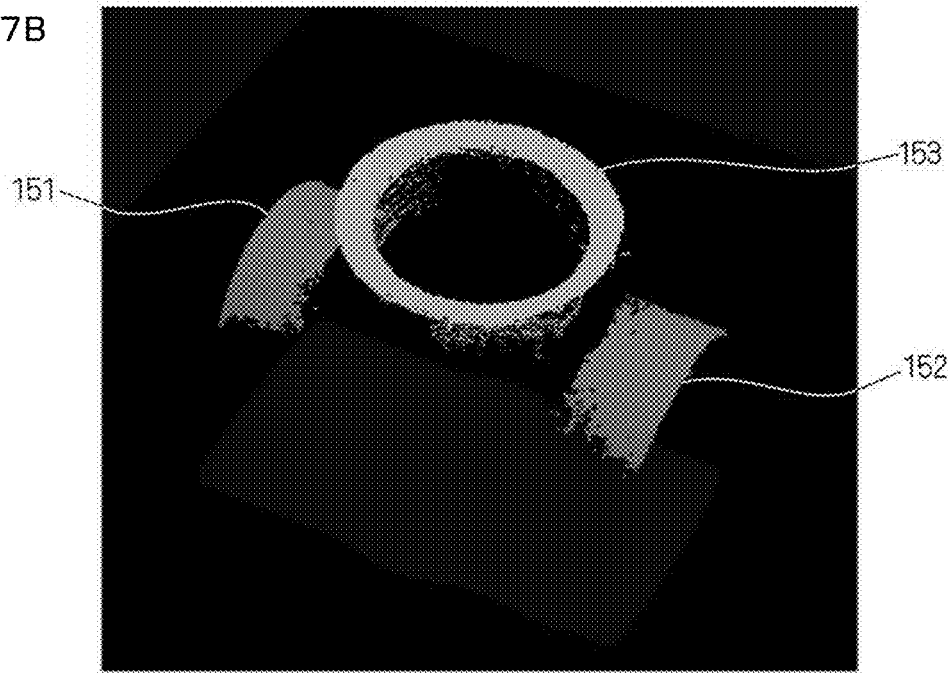

FIGS. 17A and 17B are views each illustrating a height image of the workpiece W of the joint. FIG. 17A is a top plan view of the workpiece W, and FIG. 17B is a view illustrating an example of a 3D display of the workpiece W. For example, when the offset height (the threshold value in the height direction) from the background surface is set to be lower than the height of the center of gravity, the display contents illustrated in FIGS. 17A and 17B are not changed.

Meanwhile, when the offset height (the threshold value in the height direction) from the background surface is set to be higher than the height of the center of gravity by a predetermined degree or higher, a part, which is not displayed in the display contents illustrated in FIGS. 17A and 17B, occurs. That is, when the offset height (the threshold value in the height direction) from the background surface is set to be lower than the height of the center of gravity, all of the holes 151, 152, and 153 are displayed as the holding targets. However, when the offset height (the threshold value in the height direction) from the background surface is set to be higher than the height of the center of gravity by a predetermined degree or higher, the holes 151 and 152 are not displayed.

Figure 18A:
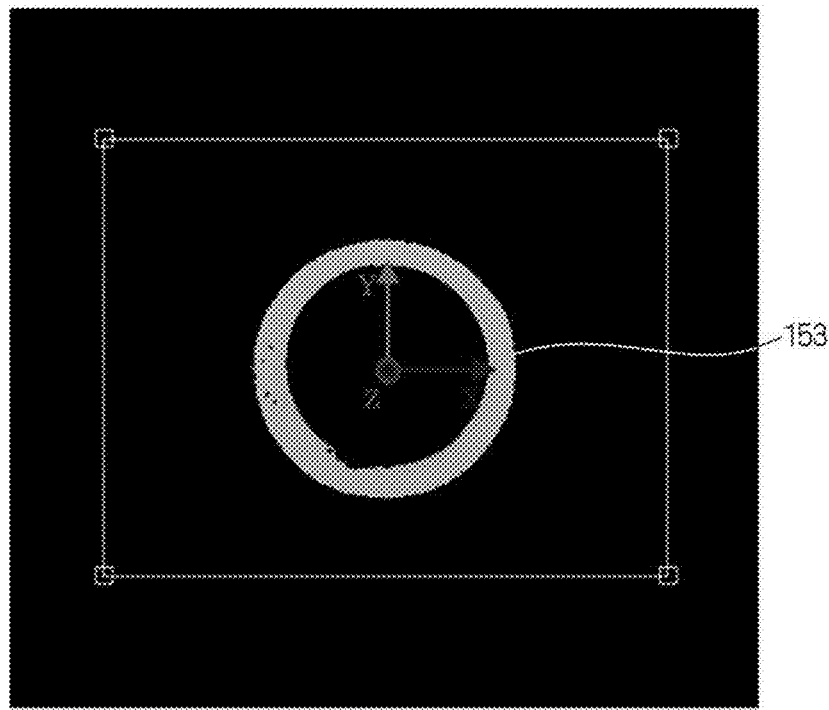
FIGS. 18A and 18B are views each illustrating an example of a height image of the workpiece of the joint when an offset height (a threshold value in a height direction) from a background surface is set to be greater than a height of a center of gravity by a predetermined degree or higher.
Figure 18B:
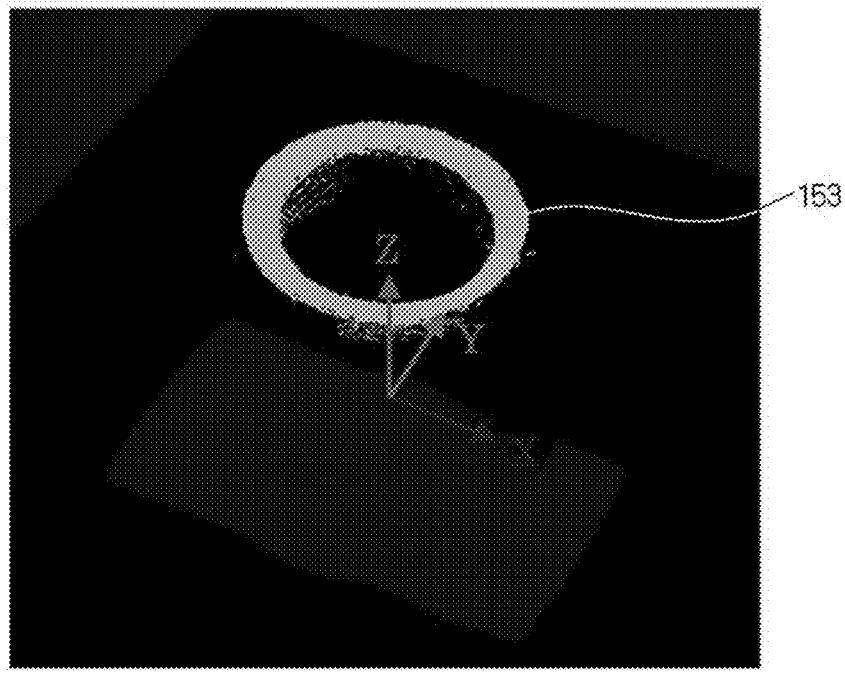

FIGS. 18A and 18B are views each illustrating an example of a height image of the workpiece W of the joint when the offset height (the threshold value in the height direction) from the background surafce is set to be higher than the height of the center of gravity by a predetermined degree or higher. FIG. 18A is a top plan view of the workpiece W, and FIG. 18B is a view illustrating an example of a 3D display of the workpiece W. In this way, it is possible to register only the hole 153 as a model of the three-dimensional search process, among the three holes having the common shape, by adjusting the offset height from the background surface. In this way, among the parts having the common shape, the holding posture is registered only for the hole 153. Since the three-dimensional search process can also be performed on the other holes 151 and 152, it is also possible to calculate the holding posture.

As described above, it is not necessary to register the holding posture for each hole of the workpiece W of the joint, and it is possible to obtain multiple holding candidates only with minimum setting. Thus, it is possible to efficiently and simply perform teaching of the holding posture. In the existing method using CAD data, since it is necessary to register a holding posture for the shape of each hole, a labor-intensive operation is inevitably required.

According to the present exemplary embodiment as described above, even if no CAD data of a workpiece W are present, it is possible to register a workpiece model of the workpiece W, which becomes the holding target of a robot 5, using the three-dimensionally measured data of the workpiece which is actually and three-dimensionally measured. In addition, a model coordinate system is set with respect to the workpiece W, and a relative holding position is set with respect to the model coordinate system. Therefore, it is possible to perform the operation without registering an image, which becomes a master, and a holding position again unlike the related art even if the relative positional relationship between an image capturing unit and a robot is changed. Further, the origin of the workpiece W, which becomes a holding target, may be freely set. Thus, it is possible to register the holding posture and the workpiece model for the three-dimensional search process by extracting only a common shape in a case in which multiple common shapes are present like a "joint". As a result, it is possible to perform the setting with a high degree of freedom and to efficiently and simply perform the teaching of the holding posture.

The present invention is not limited to the exemplary embodiment, and various modifications and improvements can be made as long as they are within the scope of gist of the present invention. For example, even though a coordinate value group of characteristic points is used as a target for the three-dimensional search process, the present invention is not limited thereto as long as the method may specify a target which may be held by the holding unit 50 of the robot 5.

What is claimed is:

1. An image processing device that controls a picking operation of a robot in which the robot holds a workpiece that is disposed on a flat surface or holds workpieces loaded in bulk using a holding unit and moves a held workpiece to a predetermined position, the image processing device comprising:

a sensing unit that obtains three-dimensionally measured data a) by performing a three-dimensional measurement on a working space in which the workpieces are loaded in bulk or b) by performing the three-dimensional measurement on the working space in which the workpiece is disposed on a flat surface;

a workpiece model creating unit that creates a workpiece model indicating a shape of the workpiece, except for a background region portion of the workpiece, based on the three-dimensionally measured data obtained by the three-dimensional measurement;

a coordinate system setting unit that sets a model coordinate system of the created workpiece model;

a holding data setting unit that sets holding data, as relative position data in the set model coordinate system, including a holding position of the workpiece model and a posture of the holding unit of the robot when holding the holding position;

a holding data storage unit that repeats setting of the model coordinate system and setting of the holding data with respect to multiple workpiece models created based on the three-dimensionally measured data obtained by the three-dimensional measurement while sequentially changing the posture of the workpiece, and stores multiple pieces of holding data such that the multiple pieces of holding data correspond to the workpiece models, respectively;

a search process performing unit that performs a three-dimensional search process using the multiple created workpiece models with respect to the three-dimensionally measured data obtained by the three-dimensional measurement; and a control unit that controls an operation of the holding unit of the robot so as to hold the workpiece model succeeded in the three-dimensional search process based on the holding data corresponding to the workpiece model succeeded in the three-dimensional search process by the search process performing unit.

2. The image processing device according to claim 1, wherein the workpiece model creating unit includes:

a setting receiving unit that receives setting of a threshold value in a height direction in the set model coordinate system; and a background region adjusting unit that sets a region having information about a height equal to or lower than the threshold value in the height direction as the background region portion.

3. The image processing device according to claim 1, wherein the coordinate system setting unit sets the model coordinate system of the workpiece model based on shape information indicating a shape of the created workpiece model.

4. An image processing method capable of being performed by an image processing device which controls a picking operation of a robot in which the robot holds a workpiece that is disposed on a flat surface or holds workpieces loaded in bulk with a holding unit and moves a held workpiece to a predetermined position, wherein the image processing method comprises:

a first process of obtaining three-dimensionally measured data a) by performing a three-dimensional measurement on a working space in which the workpieces are loaded in bulk or b) by performing the three-dimensional measurement on the working space in which the workpiece is disposed on a flat surface;

a second process of creating a workpiece model indicating a shape of the workpiece, except for a background region portion of the workpiece, based on the three-dimensionally measured data obtained by the three-dimensional measurement;

a third process of setting a model coordinate system of the created workpiece model;

a fourth process of setting holding data, as relative position data in the set model coordinate system, including a holding position of the workpiece model and a posture of the holding unit of the robot when holding the holding position;

a fifth process of repeating the setting of the model coordinate system and the setting of the holding data with respect to multiple workpiece models created based on the three-dimensionally measured data obtained by the three-dimensional measurement while sequentially changing the posture of the workpiece, and storing multiple pieces of holding data such that the multiple pieces of holding data correspond to the workpiece models, respectively;

a sixth process of performing a three-dimensional search process using the multiple created workpiece models with respect to the three-dimensionally measured data obtained by the three-dimensional measurement; and a seventh process of controlling an operation of the holding unit of the robot so as to hold the workpiece model succeeded in the three-dimensional search process based on the holding data corresponding to the workpiece model succeeded in the three-dimensional search process by the sixth process.

5. The image processing method according to claim 4, wherein the second process includes:

an eighth process of receiving setting of a threshold value in a height direction in the set model coordinate system; and a ninth process of setting a region having information about a height equal to or lower than the threshold value in the height direction as the background region portion.

6. The image processing method according to claim 4, wherein the third process sets the model coordinate system of the workpiece model based on shape information indicating a shape of the created workpiece model.

7. A computer program capable of being performed by an image processing device which controls a picking operation of a robot in which the robot holds a workpiece that is disposed on a flat surface or hodlds workpieces loaded in bulk with a holding unit and moves a held workpiece to a predetermined position, the computer program causing the image processing device to serve as:

a sensing unit that obtains three-dimensionally measured data a) by performing a three-dimensional measurement on a working space in which the workpieces are loaded in bulk or b) by performing the three-dimensional measurement on the working space in which the workpiece is disposed on a flat surface;

a workpiece model creating unit that creates a workpiece model indicating a shape of the workpiece, except for a background region portion of the workpiece, based on the three-dimensionally measured data obtained by the three-dimensional measurement;

a coordinate system setting unit that sets a model coordinate system of the created workpiece model;

a holding data setting unit that sets holding data, as relative position data in the set model coordinate system, including a holding position of the workpiece model and a posture of the holding unit of the robot when holding the holding position;

a holding data storage unit that repeats setting of the model coordinate system and setting of the holding data with respect to multiple workpiece models created based on the three-dimensionally measured data obtained by the three-dimensional measurement while sequentially changing the posture of the workpiece, and stores multiple pieces of holding data such that the multiple pieces of holding data correspond to the workpiece models, respectively;

a search process performing unit that performs a three-dimensional search process using the multiple created workpiece models with respect to the three-dimensionally measured data obtained by the three-dimensional measurement; and a control unit that controls an operation of the holding unit of the robot so as to hold the workpiece model succeeded in the three-dimensional search process based on the holding data corresponding to the workpiece model succeeded in the three-dimensional search process by the search process performing unit.

8. The computer program according to claim 7, wherein the computer program causes the workpiece model creating unit to serve as:

a setting receiving unit that receives setting of a threshold value in a height direction in the set model coordinate system; and a background region adjusting unit that sets a region having information about a height equal to or lower than the threshold value in the height direction as the background region portion.

9. The computer program according to claim 7, wherein the computer program causes the coordinate system setting unit to serve as a unit that sets the model coordinate system of the workpiece model based on shape information indicating a shape of the created workpiece model.

* * * * *